US012137572B2

(12) United States Patent
Wei et al.

(10) Patent No.: US 12,137,572 B2
(45) Date of Patent: Nov. 5, 2024

(54) FERROELECTRIC MEMORY DEVICE AND METHOD OF MANUFACTURING THE SAME

(71) Applicant: Taiwan Semiconductor Manufacturing Company, Ltd., Hsin-Chu (TW)

(72) Inventors: Yi Yang Wei, Hsinchu (TW); Tzu-Yu Lin, Hsinchu (TW); Bi-Shen Lee, Hsinchu (TW); Hai-Dang Trinh, Hsinchu (TW); Hsing-Lien Lin, Hsin-Chu (TW); Hsun-Chung Kuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 519 days.

(21) Appl. No.: 17/385,576

(22) Filed: Jul. 26, 2021

(65) Prior Publication Data
US 2022/0278115 A1    Sep. 1, 2022

Related U.S. Application Data

(60) Provisional application No. 63/154,038, filed on Feb. 26, 2021.

(51) Int. Cl.
*H10B 53/30* (2023.01)
*H01L 49/02* (2006.01)

(52) U.S. Cl.
CPC ............. *H10B 53/30* (2023.02); *H01L 28/60* (2013.01)

(58) Field of Classification Search
CPC ........ H10B 53/30; H10B 63/84; H10B 51/30; H01L 28/60; H01L 28/55; H01L 28/57; H01L 29/78391; H01L 28/40
See application file for complete search history.

(56) References Cited

U.S. PATENT DOCUMENTS 6,376,325 B1 *  4/2002  Koo ................... H01L 28/75
                                                    438/258
10,242,989 B2 *  3/2019  Pandey ................ H01L 29/516
(Continued)

FOREIGN PATENT DOCUMENTS

| CN | 111033738 A | 4/2020 |
| KR | 20210017091 A | 2/2021 |
| TW | 202042347 A | 11/2020 |

OTHER PUBLICATIONS

U.S. Appl. No. 17/349,273 entitled "Multi-Layer Electrode To Improve Performance Of Ferroelectric Memory Device," filed Jun. 16, 2021, 26 pages of text, 9 pages of drawings.
(Continued)

*Primary Examiner* — S M Sohel Imtiaz
(74) *Attorney, Agent, or Firm* — HAYNES AND BOONE, LLP

(57) ABSTRACT

Ferroelectric stacks are disclosed herein that can improve retention performance of ferroelectric memory devices. An exemplary ferroelectric stack has a ferroelectric switching layer (FSL) stack disposed between a first electrode and a second electrode. The ferroelectric stack includes a barrier layer disposed between a first FSL and a second FSL, where a first crystalline condition of the barrier layer is different than a second crystalline condition of the first FSL and/or the second FSL. In some embodiments, the first crystalline condition is an amorphous phase, and the second crystalline condition is an orthorhombic phase. In some embodiments, the first FSL and/or the second FSL include a first metal oxide, and the barrier layer includes a second metal oxide. The ferroelectric stack can be a ferroelectric capacitor, a portion of a transistor, and/or connected to a transistor in a ferroelectric memory device to provide data storage in a non-volatile manner.

20 Claims, 17 Drawing Sheets

(56) References Cited

U.S. PATENT DOCUMENTS

| | | | |
|---|---|---|---|
| 2004/0124454 A1* | 7/2004 | Choi | H01L 28/57 |
| | | | 257/295 |
| 2005/0151210 A1* | 7/2005 | Li | H01L 29/78391 |
| | | | 257/E21.208 |
| 2011/0169135 A1* | 7/2011 | Nakao | H01L 28/82 |
| | | | 257/532 |
| 2014/0355328 A1* | 12/2014 | Muller | G11C 11/2275 |
| | | | 257/295 |
| 2017/0162587 A1* | 6/2017 | Chavan | H01L 21/02164 |
| 2019/0057860 A1* | 2/2019 | Yoon | H01L 21/28568 |
| 2019/0066917 A1* | 2/2019 | Nahar | H01G 4/30 |
| 2019/0131383 A1* | 5/2019 | Frank | H01B 3/10 |
| 2020/0227423 A1* | 7/2020 | Chavan | H01L 29/78391 |
| 2020/0251551 A1* | 8/2020 | Okita | H01L 28/57 |
| 2020/0357927 A1 | 11/2020 | Hsieh et al. | |
| 2021/0159320 A1* | 5/2021 | Liao | H01L 28/56 |
| 2022/0139934 A1* | 5/2022 | Müller | H01L 29/6684 |
| | | | 257/295 |

OTHER PUBLICATIONS

Bendoraitis, J. G.; Salomon, R. E.: Optical Energy Gaps in the Monoclinic Oxides of Hafnium and Zirconium and Their Solid Solutions. In: The Journal of Physical Chemistry, vol. 69, 1965, No. 10, S. 3666-3667.

* cited by examiner

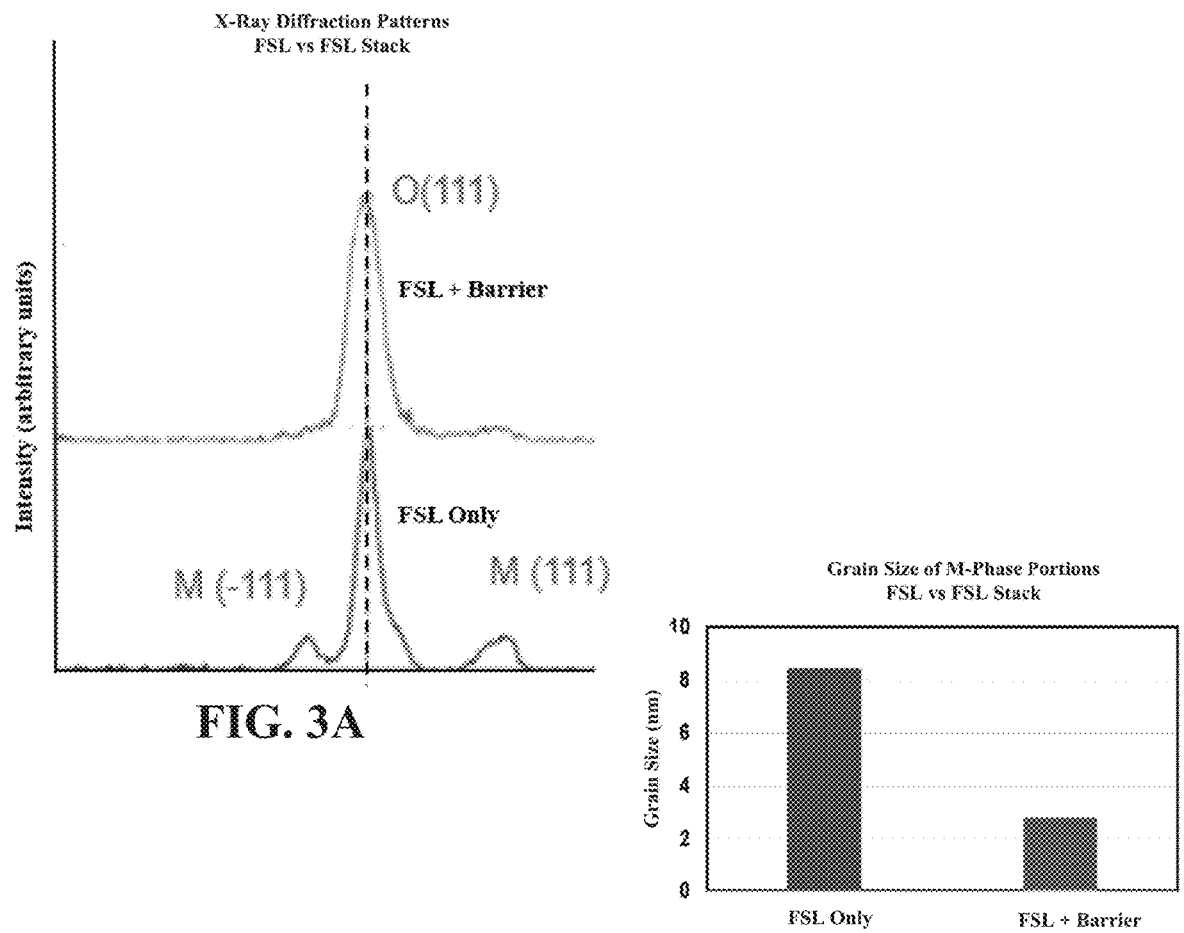
FIG. 3A
FIG. 3B
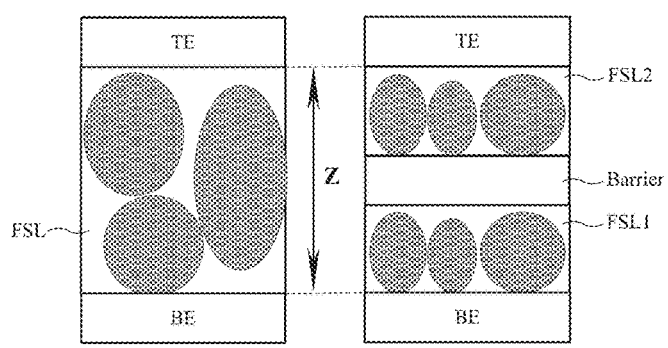
FIG. 3C

FERROELECTRIC MEMORY DEVICE AND METHOD OF MANUFACTURING THE SAME

This application is a non-provisional application of and claims benefit of U.S. Provisional Patent Application Ser. No. 63/154,038, filed Feb. 26, 2021, the entire disclosure of which is incorporated herein by reference.

BACKGROUND

Many modern-day electronic devices contain electronic memory configured to store data. Electronic memory may be volatile memory or non-volatile memory. Volatile memory generally store data while powered (i.e., stores data when powered on), while non-volatile memory can generally store data even when not powered (i.e., stores data when powered on or powered off). Ferroelectric-based memory devices are one promising candidate for next generation non-volatile memory technology because of their excellent electrical properties, such as high speed read/write time, high switching endurance, and/or low power consumption. Although existing ferroelectric-based memory devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3F provide simulated characteristics of a ferroelectric stack with and without a barrier layer according to various aspects of the present disclosure.

DETAILED DESCRIPTION

Figure 1A:
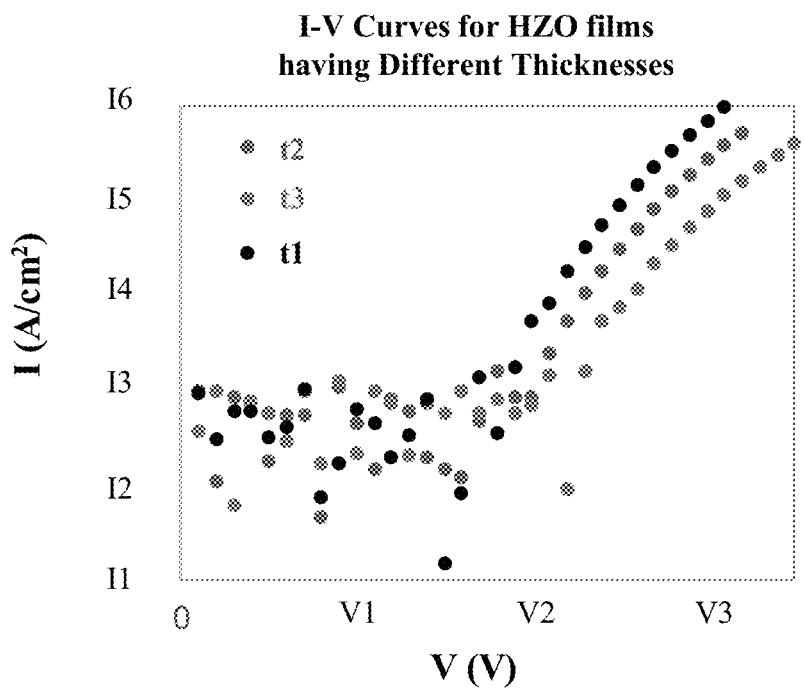
FIGS. 1A-1E provide experimental characteristics of ferroelectric layers having different thicknesses according to various aspects of the present disclosure.

The present disclosure relates generally to memory devices, and more particularly to, ferroelectric stacks for ferroelectric memory devices and methods of fabrication thereof.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

A ferroelectric memory device is a nonvolatile memory (i.e., a memory that can store data in the absence of power). A ferroelectric memory device, such as a ferroelectric random-access memory (FeRAM or FRAM) device, typically has a bottom electrode that is separated from a top electrode by a ferroelectric switching layer (FSL). The FSL includes a ferroelectric material, which generally refers to a material that exhibits polarization upon application of an electric field thereto and continues to exhibit polarization upon removal (or reduction) of the electric field. The ferroelectric material has intrinsic electric dipoles that can be switched between polarization states by the electric field, such as between a first polarization state and a second polarization state. The first polarization state can correspond with a first data state, such as a logical 1, and a first capacitance of the ferroelectric memory device. The second polarization state can correspond with a second data state, such as a logical 0, and a second capacitance of the ferroelectric memory device. A voltage line, a word line, and a bit line can be electrically connected to the ferroelectric memory device to set and/or retrieve a polarization state of the ferroelectric memory device, and thus, write and/or read data from the ferroelectric memory device. To perform a write operation, an electric field can be applied across the ferroelectric memory device to set a polarization state of the FSL to the first polarization state or the second polarization state (i.e., store a logical 1 or a logical 0), for example, by applying voltages, such as a program voltage and/or an erase voltage, to the top electrode and/or the bottom electrode via the word line and/or the voltage line, respectively. To perform a read operation, a capacitance of the ferroelectric memory device can be sensed, for example, by applying voltages, such as read voltages, to the top electrode and/or the bottom electrode via the word line and/or the voltage line, respectively, sensing a voltage on the bit line (for example, by a sense amplifier), and comparing the sensed voltage with a reference voltage on the bit line to determine whether the FSL has the first polarization state or the second polarization state, and thus whether the ferroelectric memory device is storing a logical 1 or a logical 0.

A small amount of current, often referred to as leakage current, may undesirably flow in the FSL of the ferroelectric memory device and degrade retention performance of the ferroelectric memory device. Leakage current has been observed to depend on a thickness of the FSL. For example, FIG. 1A provides experimental current-voltage (I-V) characteristics for ferroelectric layers having different thicknesses according to various aspects of the present disclosure. In FIG. 1A, a leakage current density (I) in amps per centimeter squared ($A/cm^2$) of a ferroelectric, hafnium oxide-based layer having thickness t1 (e.g., x nanometers (nm)), a ferroelectric, hafnium oxide-based layer having thickness t2 (e.g., x+2 nm), and a ferroelectric, hafnium oxide-based layer having thickness t3 (e.g., x+5 nm) are evaluated as a function of applied voltage in volts (V). In some embodiments, the ferroelectric, hafnium oxide-based layers are hafnium zirconium oxide (HZO) layers. Leakage current density of about I1 to about I6 (e.g., about $1\times10^{-13}$ $A/cm^2$ to about $1\times10^{-8}$ $A/cm^2$) is observed as applied voltage increases from about 0 V to V3. Leakage current density for all three ferroelectric, hafnium oxide-based layers is about I1 to about I3 as applied voltage increases from 0V to V1 to V2 and then increases from about I3 to about I6 as applied voltage increases from V2 to V3 to voltages greater than V3. From FIG. 1A, it is observed that, as applied voltages increase from V2 to V3 to greater than V3, leakage current density of the ferroelectric, hafnium oxide-based layer having thickness t3 is less than leakage current density of the ferroelectric, hafnium oxide-based layer having thickness t2, which is less than leakage current density of the ferroelectric, hafnium oxide-based layer having thickness t1. In other words, leakage current density decreases as FSL thickness increases. Thicker FSLs have thus been implemented in ferroelectric memory devices to reduce their leakage current and improve their retention performance.

Figure 1B:
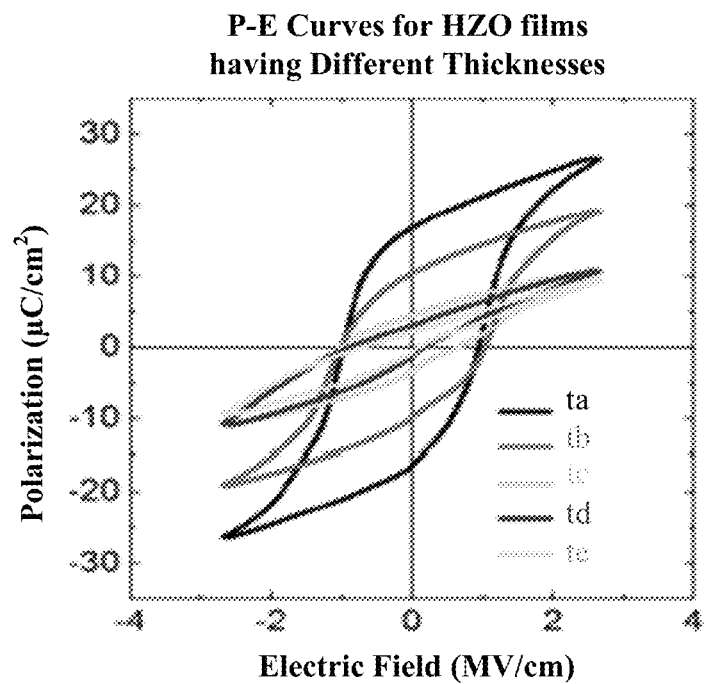

However, the present disclosure has recognized that increasing thickness of the FSL can also undesirably decrease ferroelectric characteristics of the FSL, and in some instances, cause the FSL to transition from a ferroelectric phase to a non-ferroelectric phase, thereby negating leakage current reductions and retention performance improvements gained by increasing the thickness of the FSL. For example, FIG. 1B provides experimental polarization-electric field (P-E) hysteresis loops for ferroelectric layers having different thicknesses according to various aspects of the present disclosure. In FIG. 1B, a polarization in microcoulombs per centimeter squared ($\mu C/cm^2$) of ferroelectric, hafnium oxide-based layers, such as HZO layers, having different thicknesses (e.g., thickness ta, thickness tb, thickness tc, thickness td, and thickness te) are evaluated as a function of an applied electric field in megavolts per centimeter (MV/cm). Thickness tb is greater than thickness ta, thickness tc is greater than thickness tb, thickness td is greater than thickness tc, and thickness te is greater than thickness td. From FIG. 1B, it is observed that remnant polarization ($P_r$) and saturation polarization ($P_s$) decrease as thickness of the ferroelectric, hafnium oxide-based layers increases from thickness ta to thickness te. In other words, polarization (and thus ferroelectric characteristics) decreases as FSL thickness increases. Reductions in leakage current attained by thicker FSLs may thus be offset by reductions in polarization (and thus ferroelectricity) arising from the thicker FSLs and undesirably degrade retention performance of ferroelectric memory devices.

Figure 1C:
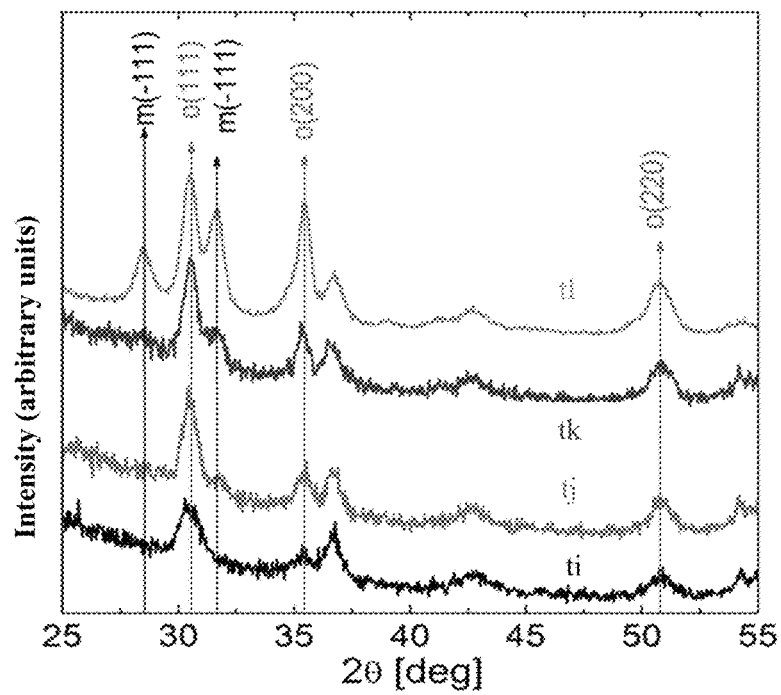

The present disclosure has recognized that these polarization decreases can be attributed to crystal phase changes that occur in the ferroelectric, hafnium oxide-based layers as their thickness increases. For example, the present disclosure recognizes that a hafnium oxide-based ferroelectric material and/or a zirconium oxide-based ferroelectric material can have a crystalline structure with one or more crystal phases, such as cubic, tetragonal, orthorhombic (i.e., O-phase), rhombohedral, hexagonal, monoclinic (i.e., M-phase), triclinic, or other crystal phase, and a crystal phase composition of the crystalline structure of the hafnium oxide-based/zirconium oxide-based ferroelectric material can affect its ferroelectricity. For example, hafnium oxide-based/zirconium oxide-based ferroelectric material having a crystalline structure having an M-phase exhibits no ferroelectricity (e.g., paraelectricity) or minimal ferroelectricity (and thus may be referred to as non-ferroelectric), while hafnium oxide-based/zirconium oxide-based ferroelectric material having a crystalline structure having an O-phase exhibits maximum ferroelectricity. FIG. 1C provides experimental x-ray diffraction patterns for ferroelectric, hafnium oxide-based layers, such as HZO layers, having different thicknesses (e.g., thickness ti, thickness tj, thickness tk, and thickness tl) according to various aspects of the present disclosure. Thickness tj is greater than thickness ti, thickness tk is greater than thickness tj, and thickness tl is greater than thickness tk. Thickness ti is less than about 10 nm (i.e., thickness ti≤10 nm). From FIG. 1C, it is observed that ferroelectric, hafnium oxide-based layer having thickness ti has peak positions corresponding with orthorhombic planes (e.g., peaks at o(111), o(200), and o(220)); ferroelectric, hafnium oxide-based layers having thickness tj and thickness tk have peak positions corresponding with orthorhombic planes (e.g., peaks at o(111), o(200), and o(220)) and a monoclinic plane (e.g., slight peaks at m(−111)); and ferroelectric, hafnium oxide-based layer having thickness tl has peak positions corresponding with orthorhombic planes (e.g., peaks at o(111), o(200), and o(220)) and monoclinic planes (e.g., peaks at m(−111) and m(111)). A crystal structure of a ferroelectric, hafnium oxide-based layer thus changes as its thickness increases, for example, from a substantially O-phase material to a multi-phase material including both O-phase portions and M-phase portions. In particular, the experimental x-ray diffraction patterns indicate that ferroelectric, hafnium oxide-based layers having thicknesses greater than 10 nm begin to exhibit both orthorhombic phase and monoclinic phase. Based on such phenomena, ferroelectricity of a ferroelectric, hafnium oxide-based layer will also decrease as thickness increases because M-phase material exhibits no ferroelectricity or less ferroelectricity than O-phase material, and sometimes, M-phase material is non-ferroelectric.

Figure 1D:
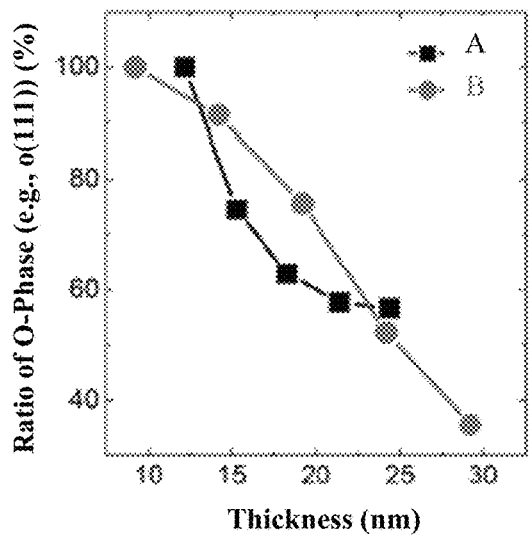
Figure 1E:
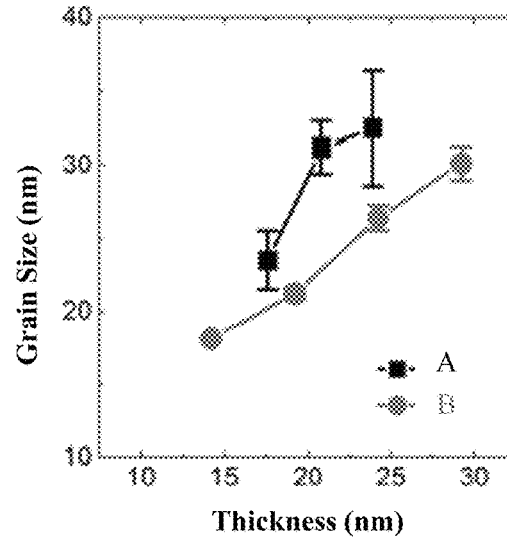

FIG. 1D provides experimental data indicating a relative ratio of an orthorhombic crystal phase (e.g., o(111)) in ferroelectric, hafnium oxide-based layers by percentage (%) as a function of their thickness in nm according to various aspects of the present disclosure; and FIG. 1E provides experimental data indicating a grain size of ferroelectric, hafnium oxide-based layers as a function of their thickness in nm according to various aspects of the present disclosure. The relative ratio of an orthorhombic crystal phase and the grain size are evaluated in ferroelectric, hafnium oxide-based layers, such as HZO layers, fabricated on different electrode materials, such as an electrode material A (e.g., iridium) and an electrode material B (e.g., titanium nitride). From FIG. 1D and FIG. 1E, it is observed that, as thickness of a ferroelectric, hafnium oxide-based layer increases (e.g., from about 10 nm to about 30 nm), a grain size of the ferroelectric, hafnium oxide-based layer increases (e.g., from about 15 nm to about 30 nm) while a percentage of the ferroelectric, hafnium oxide-based layer in an orthorhombic phase decreases (e.g., from about 100% to about 40%) regardless type of electrode material on which the ferroelectric, hafnium oxide-based layer is fabricated. Accordingly, as FSL thickness increases, it appears that grain size enlargement leads to FSLs transitioning from O-phase (and thus ferroelectric phase) to M-phase (and thus non-ferroelectric phase), which leads to decreasing ferroelectricity in the FSLs and corresponding degradation in retention performance of ferroelectric memory devices that incorporate thicker FSLs.

To overcome such challenges, the present disclosure proposes ferroelectric stacks for ferroelectric memory devices, where the ferroelectric stacks have at least two FSLs and at least one barrier layer (collectively referred to as FSL stacks), where each pair of FSLs has a respective barrier layer disposed therebetween. Barrier layers are configured to suppress grain growth that occurs as FSL thickness increases and thus suppress undesired ferroelectric phase transitions in the FSLs, such that the ferroelectric memory devices are provided with FSL stacks having thicknesses that minimize leakage current (i.e., a sum of thicknesses of the FSLs in the FSL stacks), maintains desired ferroelectric properties, and optimizes performance (e.g., the disclosed ferroelectric stacks exhibit greater retention and/or greater endurance than conventional ferroelectric stacks). Details of the proposed ferroelectric stacks and methods of fabrication thereof are described herein in the following pages and/or drawings.

Figure 2A:
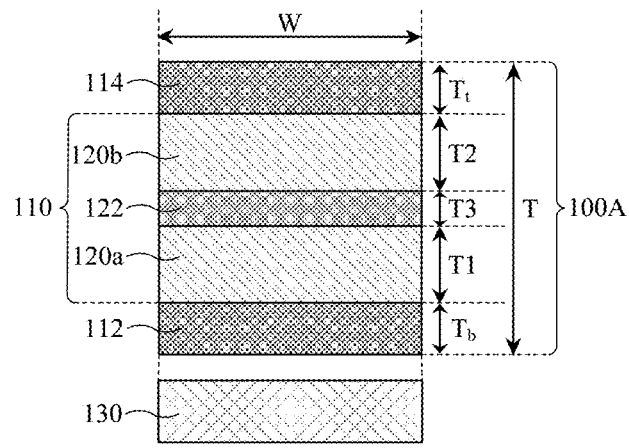
FIG. 2A and FIG. 2B are fragmentary cross-sectional views of ferroelectric stacks, in portion or entirety, according to various aspects of the present disclosure.

FIG. 2A is a fragmentary cross-sectional view of a ferroelectric stack 100A, in portion or entirety, according to various aspects of the present disclosure. Ferroelectric stack 100A is a metal-ferroelectric switching layer (FSL)-metal (MFM) stack that includes an FSL stack 110 (i.e., a multi-layer FSL) disposed between a bottom electrode 112 and a top electrode 114. Ferroelectric stack 100A can be implemented in a ferroelectric memory device. In some embodiments, the ferroelectric memory device includes a transistor connected to a capacitor, where ferroelectric stack 100A is implemented as the capacitor. In some embodiments, the ferroelectric memory device includes a transistor, where ferroelectric stack 100A is connected to or combined with a metal gate of the transistor. Such configuration can be referred to as a ferroelectric field effect transistor (FeFET)-like memory device. In some embodiments, the FeFET-like memory device has an MFM-MIS structure (i.e., an MFM stack, such as ferroelectric stack 100A, is connected to a metal-insulator-semiconductor (MIS) structure (e.g., gate electrode-gate dielectric-semiconductor substrate)), an MFMIS structure (i.e., an MFM stack, such as ferroelectric stack 100A, replaces a conventional metal gate of an MIS structure of a transistor (e.g., MFM stack-gate dielectric-semiconductor substrate)), or other suitable FeFET-like memory device structure. FIG. 2A has been simplified for the sake of clarity to better understand the inventive concepts of the present disclosure. Additional features can be added in ferroelectric memory structure 100A, and some of the features described below can be replaced, modified, or eliminated in other embodiments of ferroelectric memory structure 100A.

Bottom electrode 112 physically contacts a bottom surface of FSL stack 110, and top electrode 114 physically contacts a top surface of FSL stack 110, in the depicted embodiment. Bottom electrode 112 has a thickness $T_b$, and top electrode 114 has a thickness $T_t$. In some embodiments, thickness $T_b$ is about 50 Å to about 500 Å. In some embodiments, thickness $T_t$ is about 50 Å nm to about 500 Å. Bottom electrode 112 and top electrode 114 include metal and can alternatively be referred to as metal layers. For example, bottom electrode 112 and/or top electrode 114 include titanium, tantalum, tungsten, ruthenium, platinum, iridium, gold, palladium, osmium, molybdenum, nickel, strontium, aluminum, other suitable metal, alloys thereof (e.g., TaN, TiN, and/or other suitable alloy), or combinations thereof. In the depicted embodiment, bottom electrode 112 includes a ruthenium layer, and top electrode 114 includes a ruthenium layer. In the depicted embodiment, bottom electrode 112, alternatively or additionally, includes a tantalum nitride layer, and top electrode 114, alternatively or additionally, includes a tantalum nitride layer. In some embodiments, bottom electrode 112 and top electrode 114 have different compositions (e.g., different metal materials or the same metal materials with different constituent concentrations, such as different metal atomic percentages). In some embodiments, bottom electrode 112 and top electrode 114 have the same compositions (e.g., the same metal materials. In some embodiments, bottom electrode 112 has a multi-layer structure, such as a first bottom electrode layer disposed over a second bottom electrode layer, where the first bottom electrode layer and the second bottom electrode layer have different compositions. In some embodiments, top electrode 114 has a multi-layer structure, such as a first top electrode layer disposed over a second top electrode layer, where the first top electrode layer and the second top electrode layer have different compositions.

FSL stack 110 includes at least two FSLs and at least one barrier layer, where each barrier layer of FSL stack 110 is disposed between two adjacent FSLs. In FIG. 2A, FSL stack 110 includes two FSLs, such as an FSL 120a and an FSL 120b (i.e., an FSL pair), and one barrier layer, such as a barrier layer 122 disposed between FSL 120a and FSL 120b. FSL 120a and FSL 120b each include a ferroelectric material having a crystalline structure that optimizes ferroelectric characteristics of FSL 120a and FSL 120b. In the depicted embodiment, the crystalline structure has an orthorhombic phase (i.e., FSL 120a and FSL 120b include a ferroelectric material having an orthorhombic crystal structure). In some embodiments, a percentage of the ferroelectric material having the orthorhombic phase in FSL 120a and FSL 120b ensures maximum ferroelectricity. The ferroelectric material can be a high-k dielectric material, such as a dielectric material having a dielectric constant (k) greater than about 24 (e.g., k≥24), having an orthorhombic crystal structure. In the depicted embodiment, FSL 120a and FSL 120b include a metal oxide material, such as a hafnium oxide-based material or a zirconium oxide-based material. For example, FSL 120a and FSL 120b include hafnium, oxygen, and optionally, a dopant (e.g., zirconium, aluminum, lanthanum, cerium, silicon, gadolinium, yttrium, strontium, lead, titanium, tantalum, other suitable dopant, or combinations thereof). In such example, FSL 120a and FSL 120b can include hafnium oxide (e.g., $Hf_xO_y$), hafnium zirconium oxide (e.g., $Hf_xZr_zO_y$)(also referred to as HZO), hafnium aluminum oxide (e.g., $Hf_xAl_zO_y$), hafnium lanthanum oxide (e.g., $Hf_xLa_zO_y$), hafnium cerium oxide (e.g., $Hf_xCe_zO_y$), hafnium silicon oxide ($Hf_xSiO_y$), hafnium gadolinium oxide (e.g., $Hf_xGd_zO_y$), other suitable $Hf_xO_y$-based material, or combinations thereof, where x is a number of Hf atoms in the $Hf_xO_y$-based material, y is a number of O atoms in the $Hf_xO_y$-based material, z is a number of dopant atoms in the $Hf_xO_y$-based material, and x and y are greater than zero. In another example, FSL 120a and FSL 120b include zirconium, oxygen, and optionally, a dopant (e.g., aluminum, lanthanum, cerium, silicon, gadolinium, yttrium, strontium, lead, titanium, tantalum, other suitable dopant, or combinations thereof). In such example, FSL 120a and FSL 120b can include a $Zr_jO_k$-based material, where j is a number of Zr atoms in the $Zr_jO_k$-based material, k is a number of O atoms in the $Zr_jO_k$-based material, z is a number of dopant atoms in the $Zr_jO_k$-based material, and j and k are greater than zero. In embodiments where FSL 120a and/or FSL 120b include a dopant, a dopant concentration is less than about 50 at %. In some embodiments, FSL 120a and FSL 120b include lead zirconium titanate (PZT), strontium bismuth tantalite (SBT), bismuth lanthanum titanate (BLT), bismuth titanate (BIT), bismuth ferrite (BFO), other suitable ferroelectric material, or combinations thereof having an orthorhombic crystal structure. In some embodiments, FSL 120a and FSL 120b include the same ferroelectric materials (e.g., any difference in constituent concentrations is less than about 10 at %). In some embodiments, FSL 120a and FSL 120b include different ferroelectric materials or the same ferroelectric materials with different compositions, such as HZO with different hafnium atomic percent, different oxygen atomic percent, and/or different dopant atomic percent. During operation of a ferroelectric memory device having FSL stack 110, voltage can be applied to bottom electrode 112 and/or top electrode 114 to change a polarization state of FSL 120a and/or FSL 120b, for example, between a first polarization state and a second polarization state.

A barrier layer 122 is disposed between and separates FSL 120a and FSL 120b. Barrier layer 122 is incorporated into ferroelectric stack 100A to suppress grain growth in FSL stack 110 (in particular, in FSL 120a and/or FSL 120b) that can cause crystal phase changes that lead to undesired ferroelectric changes in FSL stack 110, such as transitions in a crystal structure of FSL stack 110 from O-phase (i.e., a ferroelectric phase) to M-phase (i.e., a non-ferroelectric phase). Barrier layer 122 includes a material having different crystalline characteristics and/or different crystalline conditions than a material of FSL 120a and FSL 120b. For example, where FSL 120a and FSL 120b include a dielectric material having a crystalline structure, barrier layer 122 incudes a dielectric material having an amorphous structure (e.g., dielectric material in non-crystalline form (i.e., having a disordered atomic structure)). Barrier layer 122 has an amorphous structure to inhibit any additional crystalline growth and/or grain growth in FSL 120a and/or FSL 120b that can lead to crystal phase changes that cause undesired ferroelectric changes in FSL 120a and/or FSL 120b. In some embodiments, barrier layer 122 includes a metal oxide material that is different than a metal oxide material of FSL 120a and FSL 120b. For example, barrier layer 122 includes aluminum, oxygen, and optionally, a dopant (e.g., hafnium, zirconium, lanthanum, cerium, silicon, gadolinium, yttrium, strontium, lead, titanium, tantalum, other suitable dopant, or combinations thereof). In such example, barrier layer 122 can include aluminum oxide (e.g., $Al_rO_s$), where r is a number of Al atoms in the $Al_rO_s$-based material, s is a number of O atoms in the $Al_rO_s$-based material, and r and s are greater than zero (e.g., $Al_2O_3$). In embodiments where barrier layer 122 includes a dopant, a dopant concentration is less than about 50 at %. In some embodiments, an energy band gap of barrier layer 122 is greater than an energy band gap of FSL 120a and FSL 120b. For example, where FSL 120a and FSL 120b include HZO in the O-phase and have an energy band gap ($E_g$) of about 5.5 electron volts (eV), barrier layer 122 includes a dielectric material, such as aluminum oxide (e.g., $Al_2O_3$), in amorphous phase having an energy band gap that is greater than 5.5 eV (i.e., $E_g$>5.5 eV). Providing barrier layer 122 with a higher energy band gap than FSL 120a and FSL 120b reduces leakage current, thereby improving retention performance and/or endurance performance.

In FIG. 2A, ferroelectric stack 100A has a thickness that is a sum of a thickness T1 of FSL 120a, a thickness T2 of FSL 120b, and a thickness T3 of barrier layer 122. Thickness T1 and thickness T2 are each greater than thickness T3. In some embodiments, thickness T1 and thickness T2 are each about 20 Å to about 500 Å (i.e., 20 Å≥T1, T2≤500 Å). In some embodiments, thickness T1 and thickness T2 are each less than a maximum thickness to ensure low voltage operation and/or low voltage power of ferroelectric stack 100A. For example, FSL 120a and/or FSL 120b having thicknesses greater than the maximum thickness (e.g., 500 Å) may result in high voltage operation, such as applied voltages greater than about 10 V, for switching polarization states in FSL 120a and/or FSL 120b, which can cause higher power consumption and thus further result in high-power operation. In some embodiments, thickness T1 and thickness T2 are each greater than a minimum thickness that provides for desired crystalline growth (e.g., crystalline structures exhibiting ferroelectric characteristics) and/or minimizes leakage current of ferroelectric stack 100A. For example, FSL 120a and/or FSL 120b having thicknesses less than the minimum thickness (e.g., 20 Å) may not have crystalline structures, and in particular, may not have crystalline structures that optimize ferroelectric characteristics, such as O-phase crystal structures. In some embodiments, thickness T1 is substantially the same as thickness T2. In some embodiments, thickness T1 is greater than thickness T2. In some embodiments, thickness T1 is less than thickness T2. In some embodiments, thickness T3 is about 1 Å to about 100 Å (i.e., 1 Å≥T3≤100 Å). In some embodiments, thickness T3 is less than a maximum thickness to ensure a voltage drop between the barrier layer and the FSLs is below a threshold voltage drop that may create depolarizing fields in the ferroelectric stack, which can degrade ferroelectric characteristics of the ferroelectric stack and/or result in high-voltage operation and/or high-power operation. For example, barrier layer 122 having a thickness greater than the maximum thickness (e.g., 100 Å) may create a voltage drop between barrier layer 122 and FSL 120a and/or FSL 120b that is greater than about 2 V (i.e., a threshold voltage drop), which can undesirably reduce polarization in FSL 120a and/or FSL 120b. Minimizing thickness of barrier layer 122 (e.g., less than about 100 Å) can provide small threshold voltage drops and thus provide low-voltage and/or low-power operation. In some embodiments, thickness T3 is greater than a minimum thickness that provides adequate interruption of grain growth in the FSLs and thus adequate suppression of crystal phase transitions (for example, from O-phase to M-phase) in the FSLs. For example, barrier layer 122 having a thickness less than the minimum thickness (e.g., 1 Å) may not adequately interrupt grain growth between FSL 120a and FSL 120b, such that FSL 120b begins forming over barrier layer 122 with a larger grain size, which increases as thickness of FSL 120b increases, and which may cause phase transitions in FSL 120b from O-phase to M-phase.

Figure 3D:
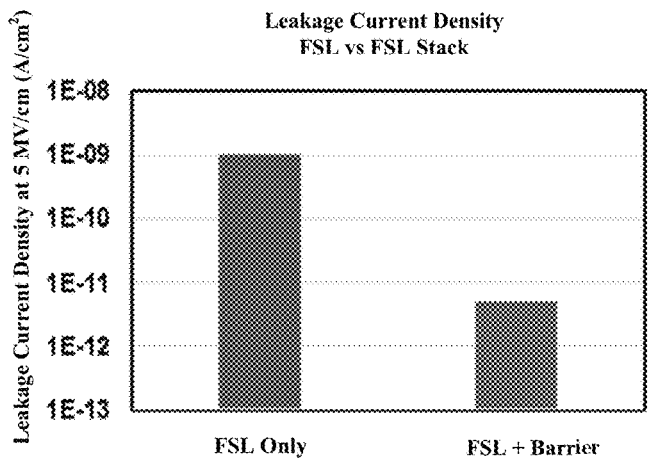
Figure 3E:
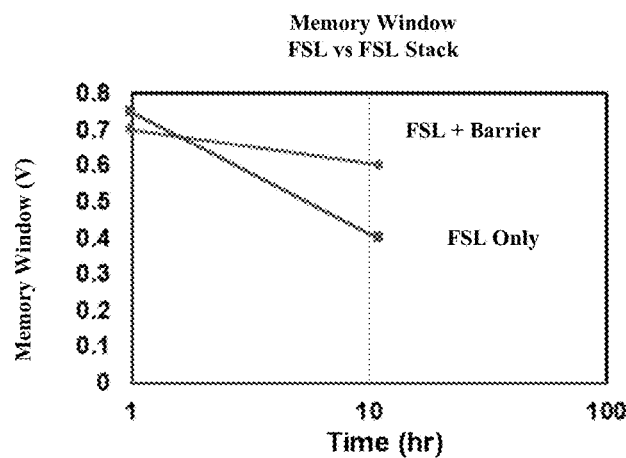
Figure 3F:
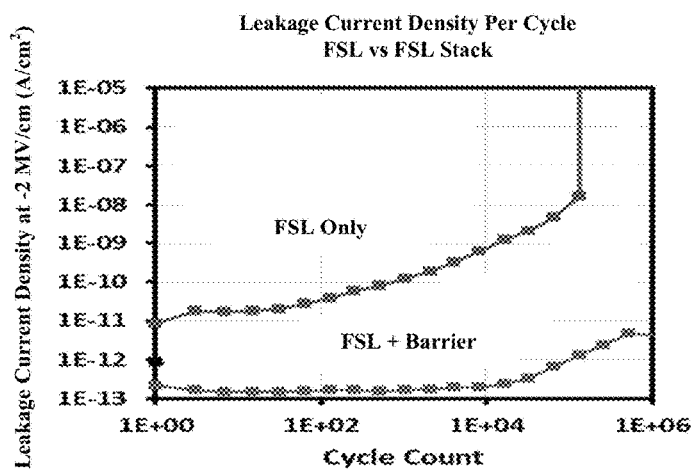

Performance enhancements of a ferroelectric stack having an FSL stack (and thus a barrier layer), such as ferroelectric stack 100A having FSL stack 110, compared to a ferroelectric stack having only an FSL (and thus no barrier layer) are evident from device and/or circuit simulations. For example, FIG. 3A depicts a ferroelectric stack having an FSL layer (i.e., no barrier layer) disposed between a top electrode (TE) and a bottom electrode (BE), and a ferroelectric stack having an FSL stack (e.g., FSL1, barrier layer, FSL2) disposed between a top electrode and a bottom electrode according to various aspects of the present disclosure; and FIGS. 3B-3F provide simulated characteristics of the ferroelectric stacks of FIG. 3A according to various aspects of the present disclosure. The characteristics were obtained using technology computer-aided design (TCAD) simulations where the FSL layer and the FSL stack have the same thickness, such as a thickness Z, the FSL layer is an HZO layer, and the FSL stack is an aluminum oxide layer disposed between HZO layers, such as FSL stack 110 having barrier layer 122 disposed between FSL 120a and FSL 120b. From FIG. 3B, which provides simulated x-ray diffraction patterns for the ferroelectric stacks, it is observed that the ferroelectric stack having the FSL stack (including a barrier layer) has peak positions corresponding with orthorhombic planes (e.g., peaks at o(111)) but not monoclinic planes, while the ferroelectric stack having the FSL layer and no barrier layer has peak positions corresponding with orthorhombic planes (e.g., peaks at o(111)) and monoclinic planes (e.g., peaks at m(−111) and m(111)). From FIG. 3C, which provides simulated results for grain size (in nm) of M-phase portions of the ferroelectric stacks, it is observed that an average grain size of M-phase portions of the ferroelectric stack having the FSL stack is less than (for example, about three times less than) an average grain size of M-phase portions of the ferroelectric stack having the FSL layer. Simulated material characteristic results thus reveal that inserting barrier layer into a ferroelectric stack suppresses/minimizes M-phase growth and/or decreases grain sizes of any M-phase portions in the ferroelectric stack, thereby suppressing/minimizing transitions in the ferroelectric stack from ferroelectric to non-ferroelectric and enhancing ferroelectricity of the ferroelectric stack. In FIGS. 3D-3F, simulated performance results reveal that these phase suppressions correspond with improvements in overall performance of the ferroelectric stack having the FSL stack (with barrier layer) compared to the ferroelectric stack having the FSL layer (without barrier layer). From FIG. 3D, which provides simulated results for leakage current (A/cm$^2$) for the ferroelectric stacks upon applying an electric field (for example, 5 MV/cm), it is observed that leakage current decreases about two orders by inserting a barrier layer into a ferroelectric stack (for example, from about $1 \times 10^{-9}$ Å/cm$^2$ to about $1 \times 10^{-11}$ Å/cm$^2$). From FIG. 3E, which provides simulated results for a memory window (i.e., a difference between threshold voltages due to polarization switching) for the ferroelectric stacks in volts (V) over time (in hours (hrs)), it is observed that memory window is greater over time and memory window loss over time decreases (for example, from about 47% (e.g., about 0.75 V to about 0.4 V) to about 14% (e.g., about 0.7 V to about 0.6 V) over about ten hours) by inserting a barrier layer into a ferroelectric stack. From FIG. 3F, which provides simulated results for leakage current (A/cm$^2$) over cycle time for the ferroelectric stacks upon applying an electric field (for example, −2 MV/cm), it is observed that leakage current is less per cycle, leakage current remains less as a number of cycles increases, and fatigue is delayed by inserting a barrier layer into a ferroelectric stack. Accordingly, ferroelectric stacks having FSL stacks (and, in particular, FSL stacks that incorporate a barrier layer, such as barrier layer 122) exhibit less leakage current, greater retention, and/or greater endurance than ferroelectric stacks having FSLs with no barrier layer. Such performance improvements are provided because barrier layer 122 has a higher energy band gap than FSL 120a and/or FSL 120b, which reduces leakage current and improves retention performance and/or endurance performance of ferroelectric stack 100A. Further, barrier layer 122 can reduce and/or eliminate M-phase portions from the FSLs and/or shrink grain size of any M-phase portions of the FSLs, thereby suppressing non-ferroelectric conditions, enhancing ferroelectric crystalline formation in the FSLs, and enhancing ferroelectricity. In some embodiments, a volume of M-phase portions (regions) in FSL 120a and/or FSL 120b that is less than about 10% and/or a grain size of M-phase portions in FSL 120a and/or FSL 120b that is less than about 3 nm can optimize ferroelectric crystalline conditions in FSL 120a and/or FSL 120b.

Ferroelectric stack 100A is disposed over a substrate 130. In some embodiments, ferroelectric stack 100A is disposed directly on substrate 130, such that bottom electrode 112 physically contacts substrate 130. In some embodiments, one or more layers are disposed between ferroelectric stack 100A and substrate 130. In some embodiments, ferroelectric stack 100A is electrically, but not physically, connected to substrate 130. In some embodiments, substrate 130 is a semiconductor substrate, such as a silicon substrate, where bottom electrode 112 physically contacts the semiconductor substrate. In some embodiments, substrate 130 includes a dielectric feature, such as an isolation feature (e.g., a shallow trench isolation (STI) structure, a deep trench isolation (DTI) structure, a local oxidation of silicon (LOCOS) structure, or other suitable isolation feature), where bottom electrode 112 physically contacts the dielectric feature. In some embodiments, substrate 130 includes a semiconductor feature and/or a metal feature, where bottom electrode 112 physically contacts the semiconductor feature and/or the metal feature. In some embodiments, substrate 130 is a device substrate that includes various passive and active electronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LD-MOS) transistors, high voltage transistors, high frequency transistors, other suitable electronic devices, or combinations thereof. In some embodiments, ferroelectric stack 100A is electrically and/or physically connected to one or more of the electronic devices of substrate 130. In some embodiments, ferroelectric stack 100A forms a portion of one or more of the electronic devices of the device substrate (i.e., substrate 130).

Figure 2B:
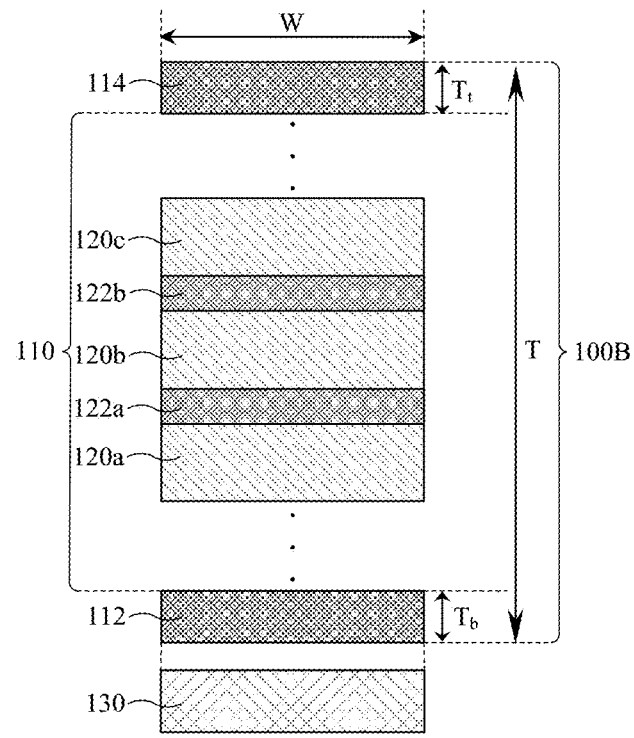

The present disclosure contemplates ferroelectric stacks having FSL stacks having multiple barrier layers, where each of the barrier layers is disposed between a respective FSL pair. For example, FIG. 2B is a fragmentary cross-sectional view of a ferroelectric stack 100B, in portion or entirety, according to various aspects of the present disclosure. Ferroelectric stack 100B in FIG. 2B is similar in many respects to ferroelectric stack 100A in FIG. 2A, except ferroelectric stack 100B includes more than one barrier layer and more than two FSLs. For example, in FIG. 2B, FSL stack 110 includes three FSLs, such as FSL 120a, FSL 120b, and an FSL 120c, and two barrier layers, such as a barrier layer 122a and a barrier layer 122b. Barrier layer 122a is disposed between FSL 120a and FSL 120b (i.e., a first FSL pair), and barrier layer 122b is disposed between FSL 120b and FSL 120c (i.e., a second FSL pair). FSL 120c is similar to and configured as FSL 120a and FSL 120b, and barrier layer 122a and barrier layer 122b are similar to and configured as barrier layer 122. For example, FSL 120c includes a ferroelectric, high-k dielectric material having an orthorhombic crystal structure, such as HZO having an orthorhombic crystal structure, and barrier layer 122a and barrier layer 122b include a dielectric material having an amorphous structure, such as aluminum oxide having an amorphous structure. In some embodiments, FSL 120c includes the same ferroelectric material as FSL 120a and/or FSL 120b. In some embodiments, FSL 120a, FSL 120b, and/or FSL 120c include different ferroelectric materials or the same ferroelectric materials with different compositions. In some embodiments, barrier layer 122a and barrier layer 122b include the same dielectric. In some embodiments, barrier 122a and barrier layer 122b include different dielectric materials or the same dielectric materials with different compositions (e.g., aluminum oxide with different aluminum atomic percent, different oxygen atomic percent, and/or different dopant atomic percent). In another example, an energy band gap of barrier layer 122a and/or barrier layer 122b is greater than an energy band gap of FSL 120a, FSL 120b, and/or FSL 120c. Thicknesses of FSL 120a, FSL 120b, and/or FSL 120c are greater than thicknesses of barrier layer 122a and/or barrier layer 122b. FSL 120a, FSL 120b, and/or FSL 120c can have the same thicknesses or different thicknesses. Barrier layer 122a and barrier layer 122b can have the same thickness or different thicknesses. FIG. 2B has been simplified for the sake of clarity to better understand the inventive concepts of the present disclosure. Additional features can be added in ferroelectric stack 100B, and some of the features described below can be replaced, modified, or eliminated in other embodiments of ferroelectric stack 100B.

In FIG. 2A and FIG. 2B, both ferroelectric stack 100A and ferroelectric stack 100B have a width W and a thickness T. In some embodiments, width W is along a first direction and thickness T is along a second direction that is substantially perpendicular to the first direction. In some embodiments, the second direction is substantially perpendicular to a top surface of substrate 130 and/or the first direction is substantially parallel to the top surface of substrate 130. In some embodiments, width W is greater than about 50 Å. In some embodiments, thickness T is about 100 Å nm to about 2,000 Å. In the depicted embodiments, width W is substantially uniform along thickness T. In FIG. 2A, a width of bottom electrode 112, a width of FSL 120a, a width of barrier layer 122, a width of FSL 120b, and a width of top electrode 114 are substantially the same. In FIG. 2B, a width of bottom electrode 112, a width of FSL 120a, a width of barrier layer 122a, a width of FSL 120b, a width of barrier layer 122b, a width of FSL 120c, and a width of top electrode 114 are substantially the same. In FIG. 2A and FIG. 2B, sidewalls of FSL stacks 110, sidewalls of bottom electrodes 112, and sidewalls of top electrodes 114 are substantially aligned, such that ferroelectric stack 100A and ferroelectric stack 100B have substantially vertical sidewalls that extend between a bottom surface of bottom electrode 112 and a top surface of top electrode 114. Ferroelectric stack 100A and ferroelectric stack 100B are thus configured as rectangles. In some embodiments, the sidewalls of ferroelectric stack 100A and/or ferroelectric stack 100B are substantially vertical relative to the top surface of substrate 130. In FIG. 2A and FIG. 2B, each layer of ferroelectric stack 100A and ferroelectric stack 100B also has a substantially uniform width, where each layer of ferroelectric stack 100A and ferroelectric stack 100B has a substantially flat (e.g., horizontal) top surface and a substantially flat (e.g., horizontal) bottom surface, where the top surface and the bottom surface are substantially parallel. In such embodiments, bottom electrode 112, FSL 120a, barrier layer 122, FSL 120b, and top electrode 114 are configured as rectangles having substantially vertical sidewalls that extend between their respective top surface and respective bottom surface.

Figure 4A:
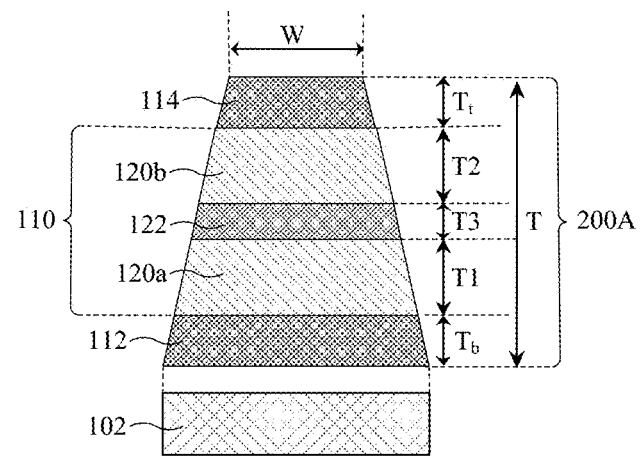
FIG. 4A, FIG. 4B, FIG. 5A, FIG. 5B, FIG. 6A, and FIG. 6B are fragmentary cross-sectional views of ferroelectric stacks, in portion or entirety, having various configurations according to various aspects of the present disclosure.
Figure 4B:
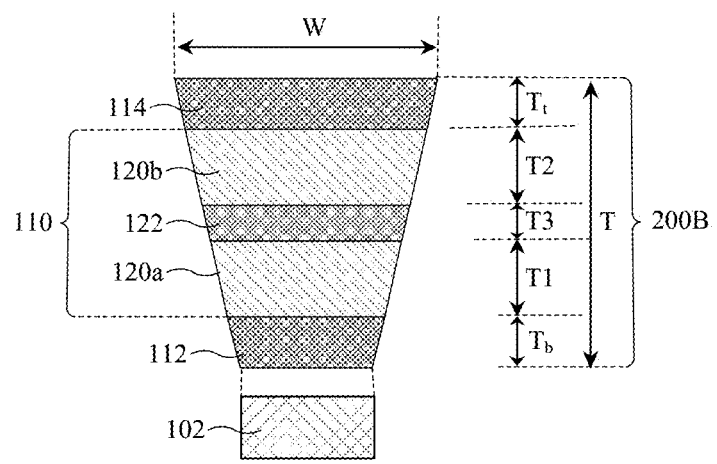

The present disclosure contemplates ferroelectric stacks having varying widths. For example, FIG. 4A and FIG. 4B are fragmentary cross-sectional views of ferroelectric stacks, such as a ferroelectric stack 200A and a ferroelectric stack 200B, having tapered widths, in portion or entirety, according to various aspects of the present disclosure. Ferroelectric stack 200A in FIG. 4A and ferroelectric stack 200B in FIG. 4B are similar in many respects to ferroelectric stack 100A in FIG. 2A, except ferroelectric stack 200A and ferroelectric stack 200B each have a tapered width. In FIG. 4A, ferroelectric stack 200A has a tapered width that decreases along its thickness T, such that width W of ferroelectric stack 200A decreases from a first width at a bottom of ferroelectric stack 200A to a second width at a top of ferroelectric stack 200A. For example, a width of bottom electrode 112 is greater than a width of FSL 120a, the width of FSL 120a is greater than a width of barrier layer 122, the width of barrier layer 122 is greater than a width of FSL 120b, and the width of FSL 120b is greater than a width of top electrode 114. In FIG. 4B, ferroelectric stack 200B has a tapered width that increases along thickness T, such that width W of ferroelectric stack 200B increases from a first width at a bottom of ferroelectric stack 200B to a second width at a top of ferroelectric stack 200B. For example, a width of bottom electrode 112 is less than a width of FSL 120a, the width of FSL 120a is less than a width of barrier layer 122, the width of barrier layer 122 is less than a width of FSL 120b, and the width of FSL 120b is less than a width of top electrode 114. In FIG. 4A and FIG. 4B, each layer of ferroelectric stack 200A and ferroelectric stack 200B also has a tapered width. For example, bottom electrode 112, FSL 120a, barrier layer 122, FSL 120b, and top electrode 114 have widths that decrease (FIG. 4A) or increase (FIG. 4B) along thickness Tb, thickness T1, thickness T3, thickness T2, and thickness $T_t$, respectively. In some embodiments, each layer of ferroelectric stack 200A and ferroelectric stack 200B has a substantially flat (e.g., horizontal) top surface and a substantially flat (e.g., horizontal) bottom surface, where the top surface and the bottom surface are substantially parallel. In such embodiments, bottom electrode 112, FSL 120a, barrier layer 122, FSL 120b, and top electrode 114 are configured as trapezoids having slanted sidewalls that extend between their respective top surface and respective bottom surface. In furtherance of such embodiments, ferroelectric stack 200A and ferroelectric stack 200B are also configured as trapezoids, where ferroelectric stack 200A and ferroelectric stack 200B each have a negatively sloped sidewall and a positively sloped sidewall (generally referred to as slanted sidewalls) that extend between a bottom surface of bottom electrode 112 and a top surface of top electrode 114, such as depicted. In some embodiments, the negatively sloped sidewall and the positively sloped sidewall have different degrees of slope (i.e., different slope angles). In some embodiments, ferroelectric stack 200A and/or ferroelectric stack 200B have slanted sidewalls relative to, for example, the top surface of substrate 130. In some embodiments, ferroelectric stack 200A and/or ferroelectric stack 200B have slanted sidewalls that extend along the same direction (i.e., both sidewalls are negatively sloped or positively sloped), such that ferroelectric stack 200A and/or ferroelectric stack 200B are configured as parallelograms. In some embodiments, one or more layers of ferroelectric stack 200A and ferroelectric stack 200B have substantially uniform widths along their respective thickness instead of a tapered width. In such embodiments, ferroelectric stack 200A and ferroelectric stack 200B may still have tapered widths that increase or decrease in a step-like manner. For example, bottom electrode 112, FSL 120a, barrier layer 122, FSL 120b, and top electrode 114 each have a uniform width, but a width of bottom electrode 112 is greater than (or less than) a width of FSL 120a, which is greater than (or less than) a width of barrier layer 122, which is greater than (or less than) a width of FSL 120b, which is greater than (or less than) a width of top electrode 114 (i.e., the width increases (or decreases) from a first width to a second width in a step-like manner). In such example, sidewalls of bottom electrodes 112, sidewalls of FSL 120a, sidewalls of barrier layer 122, sidewalls of FSL 122b, and/or sidewalls of top electrodes 114 are not substantially aligned. In some embodiments, ferroelectric stack 200A and/or ferroelectric stack 200B can include more than one barrier layer. FIG. 4A and FIG. 4B have been simplified for the sake of clarity to better understand the inventive concepts of the present disclosure. Additional features can be added in ferroelectric stack 200A and/or ferroelectric stack 200B, and some of the features described below can be replaced, modified, or eliminated in other embodiments of ferroelectric stack 200A and/or ferroelectric stack 200B.

Figure 5A:
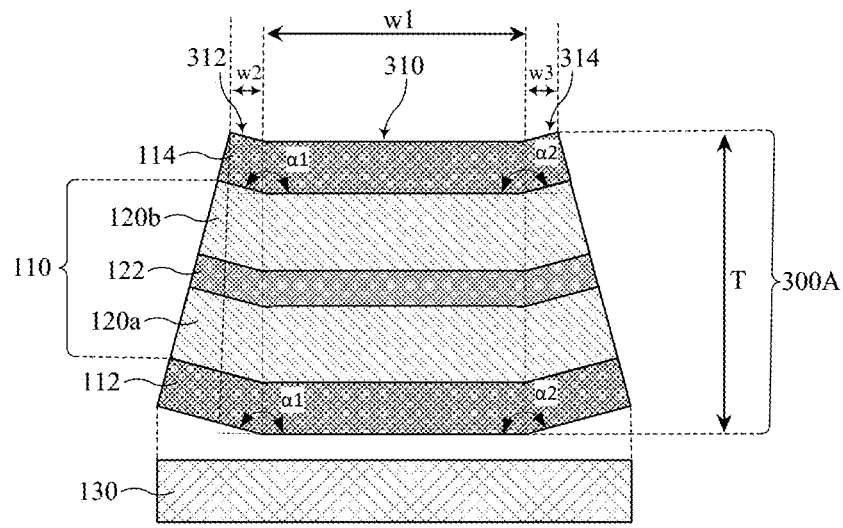
Figure 5B:
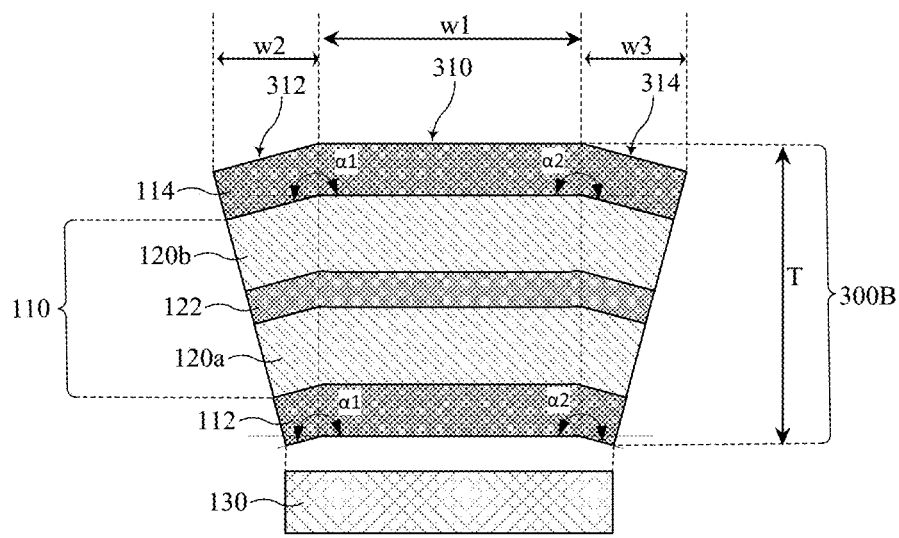

Ferroelectric stack 100A, ferroelectric stack 100B, ferroelectric stack 200A, and ferroelectric stack 200B each have layers that extend along substantially one direction (i.e., the layers are substantially linear or substantially straight) (here, along a direction substantially parallel with the top surface of substrate 130). The present disclosure contemplates ferroelectric stacks having layers with varying shapes, such as where the layers extend along more than one direction. For example, FIG. 5A and FIG. 5B are fragmentary cross-sectional views of ferroelectric stacks, such as a ferroelectric stack 300A and a ferroelectric stack 300B, having bent shapes, in portion or entirety, according to various aspects of the present disclosure. Ferroelectric stack 300A in FIG. 5A and ferroelectric stack 300B in FIG. 5B are similar in many respects to ferroelectric stack 100A in FIG. 2A, except ferroelectric stack 300A and ferroelectric stack 300B each have bent-shaped layers. In FIG. 5A and FIG. 5B, bottom electrode 112, FSL 120a, barrier layer 122, FSL 120b, and top electrode 114 each have a straight segment 310, a bent segment 312, and a bent segment 314. Straight segments 310 extend along a width direction (e.g., a horizontal direction), such as along a direction that is substantially parallel with the top surface of substrate 130. Bent segments 312 extend from straight segments 310 at angles α1, and bent segments 314 extend from straight segments 310 at angles α2. In FIG. 5A, angles α1 and angles α2 are greater than 0° and less than 180°, such that bent segments 312 and bent segments 314 extend in directions away from substrate 130. In the depicted embodiment, angles α1 and angles α2 are greater than 90°. In FIG. 5B, angles α1 and angles α2 are greater than 180° and less than 360°, such that bent segments 312 and bent segments 314 extend in directions towards substrate 130. In the depicted embodiment, angles α1 and angles α2 are less than 270°. In some embodiments, angles α1 are substantially the same as angles α2, such as depicted in FIG. 5A and FIG. 5B. In some embodiments, angles α1 and angles α2 are different. Respective angles α1 of bent segments 312 extending from straight segments 310 of bottom electrode 112, FSL 120a, barrier layer 122, FSL 120b, and/or top electrode 114 can be the same or different to provide various shapes of ferroelectric stack 300A and/or ferroelectric stack 300B. Respective angles α2 of bent segments 314 extending from connecting segments 110 of bottom electrode 112, FSL 120a, barrier layer 122, FSL 120b, and/or top electrode 114 can the same or different to provide various shapes of ferroelectric stack 300A and/or ferroelectric stack 300B. In furtherance of the depicted embodiments, straight segments 310 have substantially vertical sidewalls that extend between a top surface and a bottom surface that are substantially parallel, such that straight segments 310 have substantially uniform widths, while bent segments 312 have bent segments 314 have a substantially vertical sidewall and a slanted sidewall that extend between a top surface and a bottom surface that are substantially parallel, such that bent segments 312 and bent segments 314 have tapered widths that decrease (FIG. 5A) or increase (FIG. 5B) along thickness T. Accordingly, ferroelectric stack 300A and ferroelectric stack 300B have middle portions having width w1 disposed between end portions having tapered widths, such as a width w2 and a width w3, respectively, that decrease (FIG. 5A) or increase (FIG. 5B) along thickness T from bottom electrode 112 to top electrode 114. Further, ferroelectric stack 300A and ferroelectric stack 300B have slanted sidewalls (here, a positively sloped sidewall formed by slanted sidewalls of bent segments 312 and a negatively sloped sidewall formed by slanted sidewalls of bent segments 314 (FIG. 5A) or a negatively sloped sidewall formed by slanted sidewalls of bent segments 312 and a positively sloped sidewall formed by slanted sidewalls of bent segments 314 (FIG. 5B)), such that ferroelectric stack 300A and ferroelectric stack 300B have overall tapered widths. In some embodiments, bent segments 312 and/or bent segments 314 have substantially vertical sidewalls that extend between the top surface and the bottom surface that are substantially parallel, such that bent segments 312 and/or bent segments 314 have substantially uniform widths along thickness T and width w2 and/or width w3 of end portions of ferroelectric stack 300A and/or ferroelectric stack 300B are substantially uniform along thickness T. In some embodiments, straight segments 310 can be referred to as connecting segments, and bent segments 312 and bent segments 314 can be referred to as arm segments. In some embodiments, ferroelectric stack 300A and/or ferroelectric stack 300B can include more than one barrier layer. Various configurations of straight segments and/or bent segments for ferroelectric stacks are contemplated by the present disclosure. FIG. 5A and FIG. 5B have been simplified for the sake of clarity to better understand the inventive concepts of the present disclosure. Additional features can be added in ferroelectric stack 300A and/or ferroelectric stack 300B, and some of the features described below can be replaced, modified, or eliminated in other embodiments of in ferroelectric stack 300A and/or ferroelectric stack 300B.

Figure 6A:
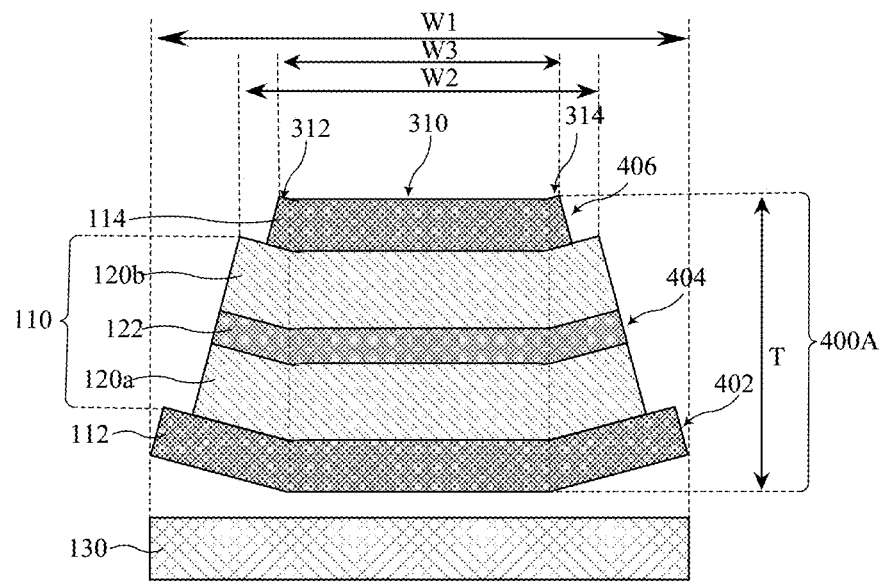
Figure 6B:
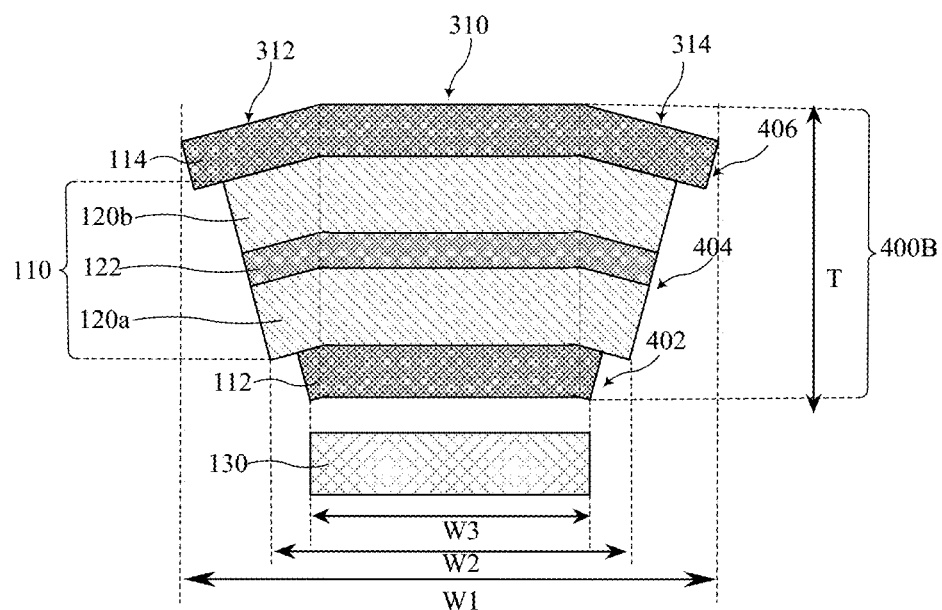

Ferroelectric stack 100A, ferroelectric stack 100B, ferroelectric stack 200A, ferroelectric stack 200B, ferroelectric stack 300A, and ferroelectric stack 300B each have substantially aligned and continuous sidewalls, regardless of a configuration of the sidewalls (e.g., substantially vertical or slanted). The present disclosure contemplates ferroelectric stacks having sidewalls configured in a step-like manner. For example, FIG. 6A and FIG. 6B are fragmentary cross-sectional views of ferroelectric stacks, such as a ferroelectric stack 400A and a ferroelectric stack 400B, having stepped sidewalls, in portion or entirety, according to various aspects of the present disclosure. Ferroelectric stack 400A in FIG. 6A is similar in many respects to ferroelectric stack 100A in FIG. 2A and ferroelectric stack 300A in FIG. 5A and ferroelectric stack 400B in FIG. 6B is similar in many respects to ferroelectric stack 100A in FIG. 2A and ferroelectric stack 300B in FIG. 5B, except ferroelectric stack 400A and ferroelectric stack 400B each have stepped sidewalls. For example, ferroelectric stack 400A and ferroelectric stack 400B have three steps—a step 402 formed by bottom electrodes 112, a step 404 formed by FSL stacks 110, and a step 406 formed by top electrodes 114. Sidewalls of the steps are not aligned with one another, but where a step includes multiple layers, sidewalls of each layer of the step are substantially aligned. For example, step 406 includes FSL 120a, barrier layer 122, and FSL 120b (i.e., FSL stack 110), where sidewalls of FSL 120a, sidewalls of barrier layer 122, and sidewalls of FSL 120b are substantially aligned with one another but are not aligned with sidewalls of bottom electrode 112 forming step 402 or sidewalls of top electrode 114 forming step 406. Step 402, step 404, and step 406 each have slanted sidewalls, such as a negatively sloped sidewall and a positively sloped sidewall. The stepped sidewalls provide ferroelectric stack 400A and ferroelectric stack 400B with widths that decrease (FIG. 6A) and increase (FIG. 6B), respectively, along thickness T in a stepped or stair-like manner. In FIG. 6A, width of ferroelectric stack 400A decreases from width W1 (step 402) to width W2 (step 404), to width W3 (step 406). In FIG. 6B, width of ferroelectric stack 400B increases from width W3 (step 402) to width W2 (step 404), to width W1 (step 406). In some embodiments, step 402, step 404, and/or step 406 have substantially vertical sidewalls. In some embodiments, step 402, step 404, and/or step 406 do not include bent segments, such as bent segments 312 and/or bent segments 314. In some embodiments, one or more layers of FSL stack 110 may have sidewalls that are not substantially aligned with sidewalls of the other layers to provide additional ferroelectric stack 400A and/or ferroelectric stack 400B with additional steps. For example, FSL 120a, barrier layer 122, and FSL 120b may have sidewalls that are not substantially aligned, thereby providing a ferroelectric stack with five steps. In some embodiments, one or more layers of FSL stack 110 may be aligned with sidewalls of bottom electrode 112 and/or sidewalls of top electrode 114, such that a step is formed from a portion of FSL stack 110 and bottom electrode 112 and/or top electrode 114. Any configuration of steps for ferroelectric stacks, including embodiments where the steps provide a ferroelectric stack with a width that increases then decreases or vice versa along thickness T (e.g., width of barrier layer 122 is less than width of FSL 120a and/or FSL 120b), is contemplated. In some embodiments, ferroelectric stack 400A and/or ferroelectric stack 400B can include more than one barrier layer. FIG. 6A and FIG. 6B have been simplified for the sake of clarity to better understand the inventive concepts of the present disclosure. Additional features can be added in ferroelectric stack 400A and/or ferroelectric stack 400B, and some of the features described below can be replaced, modified, or eliminated in other embodiments of in ferroelectric stack 400A and/or ferroelectric stack 400B.

Figure 7A:
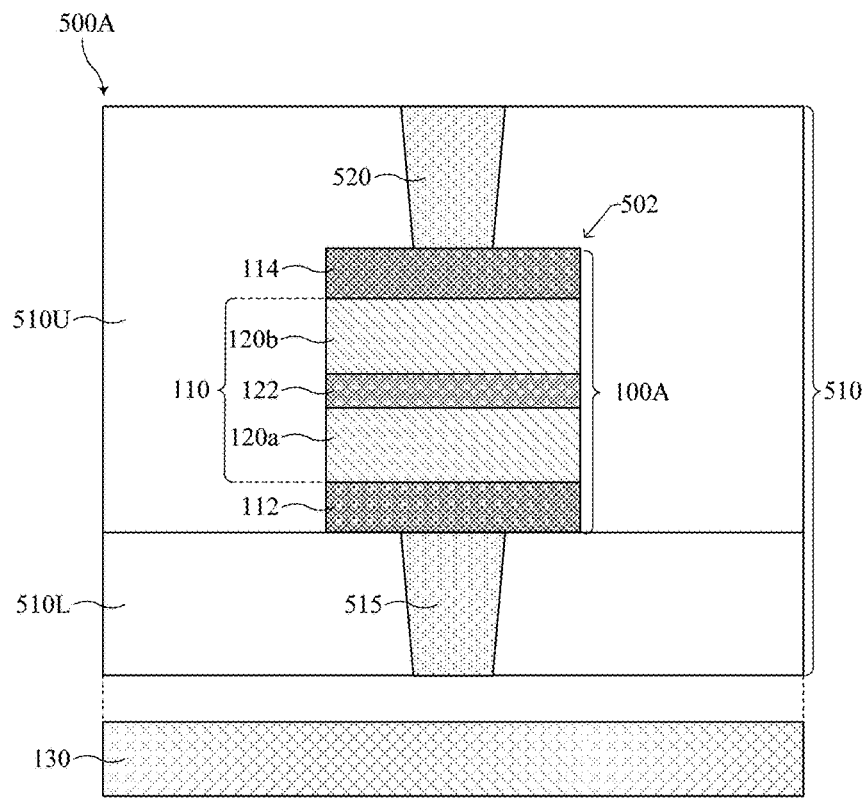
FIG. 7A, FIG. 7B, and FIG. 8 are fragmentary cross-sectional views of devices that include one or more ferroelectric-based memory cells, in portion or entirety, according to various aspects of the present disclosure.
Figure 7B:
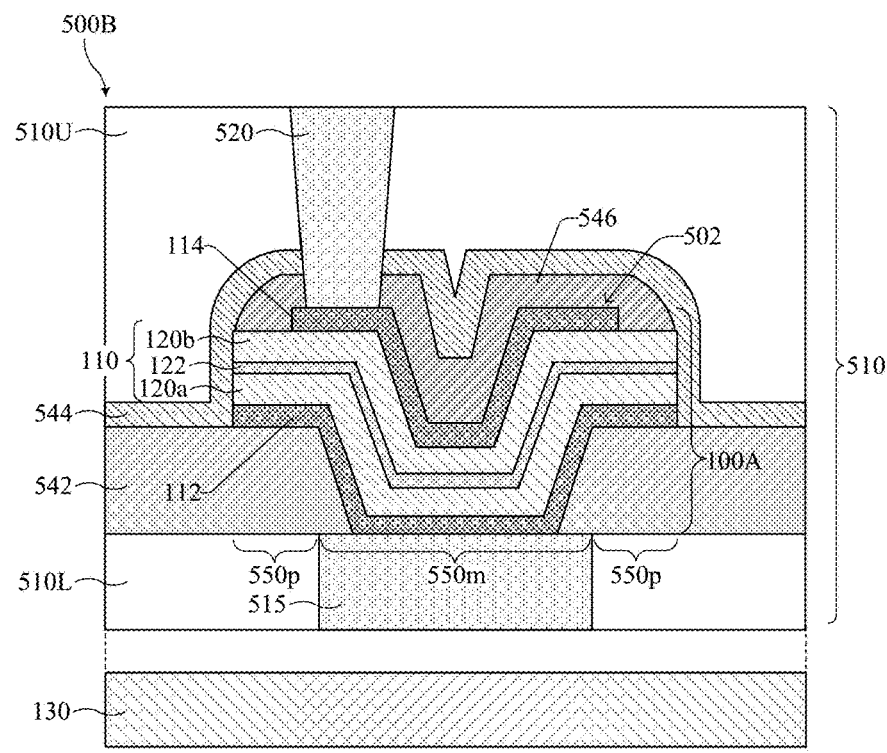

The various ferroelectric stacks disclosed herein can be implemented as and/or in a ferroelectric memory device. FIG. 7A and FIG. 7B are fragmentary cross-sectional views of a device 500A and a device 500B, each of which includes a ferroelectric-based memory cell 502 disposed in a dielectric structure 510 over substrate 130, in portion or entirety, according to various aspects of the present disclosure. Ferroelectric-based memory cell 502 can include any of the ferroelectric stacks described herein, such as ferroelectric stack 100A, as depicted in FIG. 7A and FIG. 7B. FIG. 7A and FIG. 7B have been simplified for the sake of clarity to better understand the inventive concepts of the present disclosure. Additional features can be added in device 500A and/or device 500B, and some of the features described below can be replaced, modified, or eliminated in other embodiments of device 500A and/or device 500B.

Dielectric structure 510 includes a lower dielectric portion 510L and an upper dielectric portion 510U, where ferroelectric stack 100A is disposed in the upper dielectric portion 510U. Lower dielectric portion 510L and upper dielectric portion 510U each include one or more dielectric layers, such as one or more interlayer dielectric (ILD) layers, one or more contact etch stop layers (CESLs), one or more hard mask layers, and/or one or more other dielectric layers. ILD layers include a dielectric material including, for example, silicon oxide, silicon nitride, silicon oxynitride, tetraethylorthosilicate-formed (TEOS) oxide, phosphosilicate glass (PSG), boron-doped silicate glass (BSG), boron-doped PSG (BPSG), low-k dielectric material, other suitable dielectric material, or combinations thereof. Exemplary low-k dielectric materials include fluorosilicate glass (FSG), carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, other low-k dielectric material, or combinations thereof. CESLs may be disposed between adjacent ILD layers. CESLs include a material different than ILD layers, such as a dielectric material that is different than the dielectric material of ILD layers. For example, where ILD layers include a low-k dielectric material, CESLs can include silicon and nitrogen, such as silicon nitride or silicon oxynitride.

An interconnect 515 is disposed in lower dielectric portion 510L and connected to ferroelectric-based memory cell 502 (in particular, bottom electrode 112 of ferroelectric stack 100A), and an interconnect 520 is disposed in upper dielectric portion 510U and connected to ferroelectric-based memory cell 502 (in particular, top electrode 114 of ferroelectric stack 100A). A voltage can be applied to ferroelectric-based memory cell 502 via interconnect 515 and/or interconnect 220 (for example, to bottom electrode 112 and/or top electrode 114 of ferroelectric stack 100A) to read and/or write to ferroelectric-based memory cell 502 as described herein. Interconnect 515 and interconnect 520 include a conductive material, such as metal. Metals include aluminum, copper, titanium, tantalum, tungsten, ruthenium, cobalt, iridium, palladium, platinum, nickel, alloys thereof, silicides thereof, other suitable metals, or combinations thereof. In some embodiments, interconnect 515 includes multiple conductive layers, such as a barrier layer and a bulk layer, where the barrier layer is disposed between at least a portion of lower dielectric structure 510L and the bulk layer. In some embodiments, interconnect 520 includes multiple conductive layers, such as a barrier layer and a bulk layer, where the barrier layer is disposed between at least a portion of upper dielectric structure 510U and the bulk layer.

In some embodiments, lower dielectric structure 510L, upper dielectric structure 510U, interconnect 515, and interconnect 520 are a portion of a multilayer interconnect (MLI) feature that electrically couples various devices (for example, transistors, resistors, capacitors, and/or inductors) and/or components (for example, gate structures and/or epitaxial source/drain features), such that the various devices and/or components can operate as specified by design requirements of device 500A and/or device 500B. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. In some embodiments, interconnect 515 is a metal line (i.e., horizontal interconnect) of a first metallization layer of the MLI feature, and interconnect 520 is a via (i.e., vertical interconnect) of a second metallization layer of the MLI feature, where the second metallization layer is directly above the first metallization layer and the via physically and electrically connects ferroelectric-based memory cell 502 to a metal line of the second metallization layer. During operation, the interconnect features are configured to route signals between devices and/or components of devices, such as device 500A and/or device 500B, and/or distribute signals (for example, clock signals, voltage signals, and/or ground signals) to the devices and/or the components.

In FIG. 7B, ferroelectric-based memory cell 502 is further surrounded by an insulating layer 542 and an insulating layer 544, where insulating layer 542 and insulating layer 544 are disposed between ferroelectric stack 100A and lower dielectric portion 510L and upper dielectric portion 510U, respectively. Ferroelectric stack 100A extends through insulating layer 542 to interconnect 515 and extends over a top surface of insulating layer 542, such that bottom electrode 112 is disposed along the top surface and sidewalls of insulating layer 542. Insulating layer 544 is disposed along sidewalls of bottom electrode 112 and sidewalls of FSL stack 110. Insulating layer 544 is also disposed over top surfaces of FSL stack 110 and top surfaces of top electrode 114. In FIG. 7B, a hard mask layer 546 is disposed between insulating layer 544 and ferroelectric stack 100A. For example, hard mask layer 546 is disposed between a top surface of FSL 110 (in particular, FSL 120b) and insulating layer 544, between a top surface of top electrode 114 and insulating layer 544, and between sidewalls of top electrode 114 and insulating layer 544. Interconnect 520 extends through insulating layer 544 and hard mask layer 546 to ferroelectric stack 100A (in particular, top electrode 114). In some embodiments, interconnect 520 extends partially into top electrode 114, for example, below a top surface of top electrode 114. Insulating layer 542, insulating layer 544, and hard mask layer 546 include dielectric materials, such as those described herein, that are different than a dielectric material of ILD layers of lower dielectric portion 510L and/or ILD layers of upper dielectric portion 510U. In the depicted embodiment, insulating layer 542 and insulating layer 544 include the same dielectric material, and hard mask layer 546 includes a dielectric material different than insulating layer 542 and insulating layer 544. For example, insulating layer 542 and insulating layer 544 are silicon carbide layers, and hard mask layer 546 is a silicon nitride layer. In some embodiments, insulating layer 542 and insulating layer 544 include different materials. In some embodiments, insulating layer 542 and/or insulating layer 544 are CESLs. In some embodiments, ferroelectric-based memory cell 502 includes a middle region 550m disposed between end (or peripheral) regions 550p, where middle region 550m is disposed over interconnect 515 and end regions 550p extend laterally from middle region 550m to left and right of interconnect 515. Middle region 530m has an upper portion disposed above the top surface of insulating layer 542 and a lower portion disposed below the top surface of insulating layer 542, and end regions 550p are disposed above the top surface of insulating layer 542. Layers of ferroelectric stack 100A in middle region 530m are substantially v-shaped (or u-shaped), and layers of end regions 550p are substantially rectangular-shaped. Hard mask layer 546 and insulating layer 544 conform to a shape of memory cell 502, such that hard mask layer 546 and insulating layer 544 also have v-shaped portions that correspond with middle region 530m and substantially rectangular-shaped portions that correspond with end regions 530p.

Figure 8:
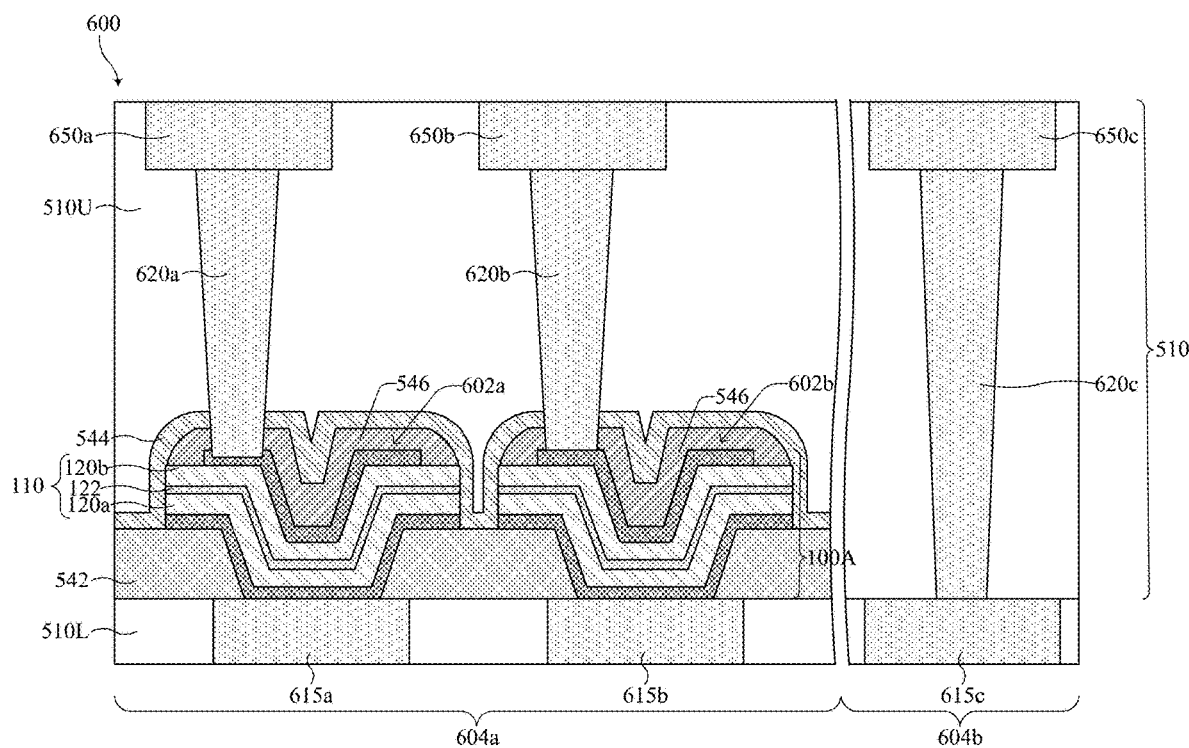

FIG. 8 is a fragmentary cross-sectional view of a device 600 that includes multiple ferroelectric-based memory cells, such as a ferroelectric-based memory cell 602a and a ferroelectric-based memory cell 602b, in portion or entirety, according to various aspects of the present disclosure. Ferroelectric-based memory cell 602a and ferroelectric-based memory cell 602b can include any of the ferroelectric stacks described herein. In FIG. 8, ferroelectric-based memory cell 602a is disposed laterally adjacent to ferroelectric-based memory cell 602b, and ferroelectric-based memory cell 602a and ferroelectric-based memory cell 602b each include a respective ferroelectric stack 100A. Device 600 has a memory region 604a disposed laterally adjacent to a logic region 604b, each of which includes dielectric structure 510 having lower dielectric portion 510L and upper dielectric portion 510U. An interconnect 615a, an interconnect 615b, and an interconnect 615c are disposed in lower dielectric portion 510L, where ferroelectric-based memory cell 602a and ferroelectric-based memory cell 602b are disposed within dielectric structure 510 of memory region 604a and physically contact interconnect 615a and interconnect 615b, respectively. An interconnect 620a, an interconnect 620b, and an interconnect 620c are disposed in upper dielectric portion 510U, where interconnect 620a and interconnect 620b physically contact ferroelectric-based memory cell 602a and ferroelectric-based memory cell 602b, respectively, and interconnect 620c physically contacts interconnect 615c. An interconnect 650a, an interconnect 650b, and an interconnect 650c are disposed in upper dielectric portion 510U, where interconnect 650a, interconnect 650b, and interconnect 650c are connected to interconnect 620a, interconnect 620b, and interconnect 620c, respectively. Interconnects 615a-615c are similar to and can be configured similar to interconnect 515 described above. Interconnects 620a-620c are similar to and can be configured similar to interconnect 520 described above. Interconnects 650a-650c are similar to and can be configured similar to interconnect 515 and/or interconnect 520 described above. In some embodiments, interconnects 620a-620c and interconnects 650a-650c form a portion of a first metallization layer (e.g., a metal x level, where x is greater than or equal to one) of an MLI feature, and interconnects 615a-615c form a portion of a second metallization layer directly below the first metallization layer (e.g., a metal x−1 level). In such embodiments, ferroelectric-based memory cell 602a and/or ferroelectric-based memory cell 602b are located between two directly adjacent metallization layers. In such embodiments, interconnects 620a-620c can be referred to as vias, and interconnects 650a-650c and interconnects 615a-615c can be referred to as metal lines. In some embodiments, ferroelectric-based memory cell 602a is electrically connected to ferroelectric-based memory cell 602b in series. In some embodiments, ferroelectric-based memory cell 602a is electrically connected to ferroelectric-based memory cell 602b in parallel. In some embodiments, ferroelectric-based memory cell 602a and/or ferroelectric-based memory cell 602b are electrically connected to another electronic device of device 600. FIG. 8 has been simplified for the sake of clarity to better understand the inventive concepts of the present disclosure. Additional features can be added in device 600, and some of the features described below can be replaced, modified, or eliminated in other embodiments of device 600.

Figure 9:
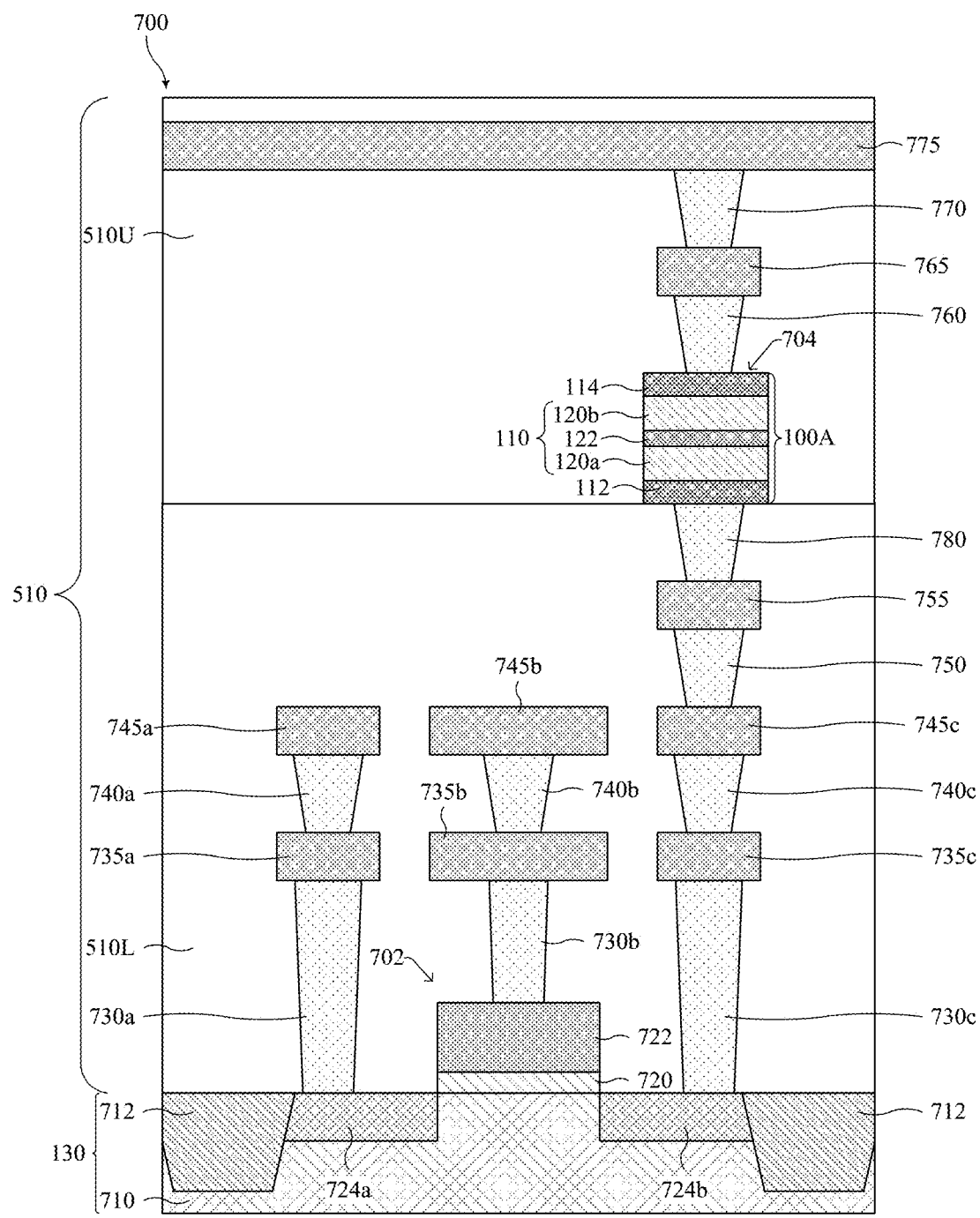
FIG. 9 is a fragmentary cross-sectional view of a ferroelectric memory device, in portion or entirety, according to various aspects of the present disclosure.

The present disclosure contemplates the ferroelectric stacks described herein being implemented as capacitors in ferroelectric memory devices. For example, FIG. 9 is a fragmentary cross-sectional view of a ferroelectric memory device 700, in portion or entirety, according to various aspects of the present disclosure. Ferroelectric memory device 700 (for example, an FeRAM) includes a transistor 702 connected to one or more capacitors, such as a ferroelectric-based capacitor 704 including any of the ferroelectric stacks described herein. In FIG. 9, ferroelectric-based capacitor 704 includes ferroelectric stack 100A, and substrate 130 is a device substrate that includes a semiconductor substrate 710 (e.g., a silicon substrate), isolation features 712 disposed in semiconductor substrate 710, and transistor 702 having a metal gate (e.g., a gate dielectric 720 and a gate electrode 722) disposed between a source/drain region 724a and a source/drain region 724b, each of which is disposed in semiconductor substrate 710. Isolation features 712 electrically isolates transistor 702 from other devices disposed within and/or on semiconductor substrate 710. In some embodiments, transistor 702 has a metal-insulator-semiconductor substrate structure (i.e., gate electrode 722-gate dielectric 720-semiconductor substrate 710 (in which a channel region is formed between source/drain region 724a and source/drain region 724b)). FIG. 9 has been simplified for the sake of clarity to better understand the inventive concepts of the present disclosure. Additional features can be added in ferroelectric memory device 700, and some of the features described below can be replaced, modified, or eliminated in other embodiments of ferroelectric memory device 700.

Gate dielectric 720 includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some embodiments, gate dielectric 720 includes a high-k dielectric layer disposed over an interfacial layer (e.g., a silicon oxide layer). Gate electrode 722 includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, gate electrode 722 includes more than one layer, such as a work function layer and a bulk (or fill) conductive layer. The work function layer is a conductive layer tuned to have a desired work function (such as an n-type work function or a p-type work function), and the conductive bulk layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function materials, or combinations thereof. The bulk conductive layer includes a suitable conductive material, such as Al, W, Cu, Ti, Ta, polysilicon, metal alloys, other suitable materials, or combinations thereof. The metal gate of transistor 702 may include numerous other layers, for example, capping layers, interface layers, diffusion layers, barrier layers, hard mask layers, or combinations thereof. Source/drain regions 724a and source/drain regions 724b include a semiconductor material, such as silicon, germanium, other suitable semiconductor material, or combinations thereof, that are doped with n-type dopants, p-type dopants, or combinations thereof. Source/drain regions 724a and source/drain regions 724b can include lightly doped source/drain (LDD) regions, heavily doped source/drain (HDD) regions, and/or epitaxial source/drain features.

Ferroelectric memory device 700 has an MLI feature that includes a metal one (M1) layer (including, for example, a device-level contact 730a, a device-level contact 730b, a device-level contact 730c, a metal line 735a, a metal line 735b, a metal line 735c, and a portion of lower dielectric portion 510L in which device-level contacts 730a-730c and metal lines 735a-735c are disposed), a metal two (M2) layer (including, for example, a via 740a, a via 740b, a via 740c, a metal line 745a, a metal line 745b, a metal line 745c, and a portion of lower dielectric portion 510L in which vias 740a-740c and metal lines 745a-745c are disposed), a metal three (M3) layer (including, for example, a via 750, a metal line 755, and a portion of lower dielectric portion 510L in which via 750 and metal line 755 are disposed), a metal four (M4) layer (including, for example, a via 760, a metal line 765, and a portion of upper dielectric portion 510U in which via 760 and metal line 765 are disposed), and a metal five (M5) layer (including, for example, a via 770, a metal line 775, and a portion of upper dielectric portion 510U in which via 770 and metal line 755 are disposed). Ferroelectric-based capacitor 704 is disposed between M3 layer and M4 layer, and ferroelectric-based capacitor 704 is electrically connected to M3 layer by a via 780 disposed in lower dielectric portion 510L and to M4 layer by via 760. Device-level contacts 730a-730c, metal lines 735a-735c, vias 740a-740c, metal lines 745a-745c, via 750, metal line 755, via 760, metal line 765, via 770, metal line 775, and via 780 are similar to and can be configured as interconnect 515, interconnect 520, and/or other interconnect described herein. Device-level contact 730a is a source/drain contact connected to source/drain region 724a of transistor 702, device-level contact 730b is a gate contact (or gate via) connected to gate electrode 722 of transistor 702, and device-level contact 730c is a source/drain contact connected to source/drain region 724b of transistor 702. In the depicted embodiment, metal line 745a is configured as a source line electrically connected to source/drain region 724a of transistor 702 by via 740a, metal line 735a, and device-level contact 730a; metal line 745b is configured as a word line electrically connected to the metal gate of transistor 702 (in particular, gate electrode 722) by via 740b, metal line 735b, and device-level contact 730b; metal line 775 is configured as a bit line electrically connected to ferroelectric-based capacitor 704 (in particular, top electrode 114 of ferroelectric stack 100A) by via 770, metal line 765, and via 760; and ferroelectric-based capacitor 704 is electrically connected to transistor 702 (in particular, bottom electrode 112 of ferroelectric stack 100A is electrically connected to source/drain region 724b) by via 780, metal line 755, via 750, metal line 745c, via 740c, metal line 735c, and device-level contact 730c. The source line, the word line, and the bit line are electrically connected to respective voltages, such that voltages can be applied to the source line, the word line, and/or the bit line to read and/or write to ferroelectric-based capacitor 704. In some embodiments, the voltages are applied to the source line, the word line, and/or the bit line to provide suitable bias conditions for writing data to and/or reading data from FSL stack 110 of ferroelectric-based capacitor 704, for example, by changing polarization states of FSL 120a and/or FSL 120b, such as described herein. The present disclosure contemplates other electrical connections between transistor 702, ferroelectric-based capacitor 704, and/or other devices to configure ferroelectric memory device 700 as a non-volatile memory that can store data, which can be read and/or written.

Figure 10:
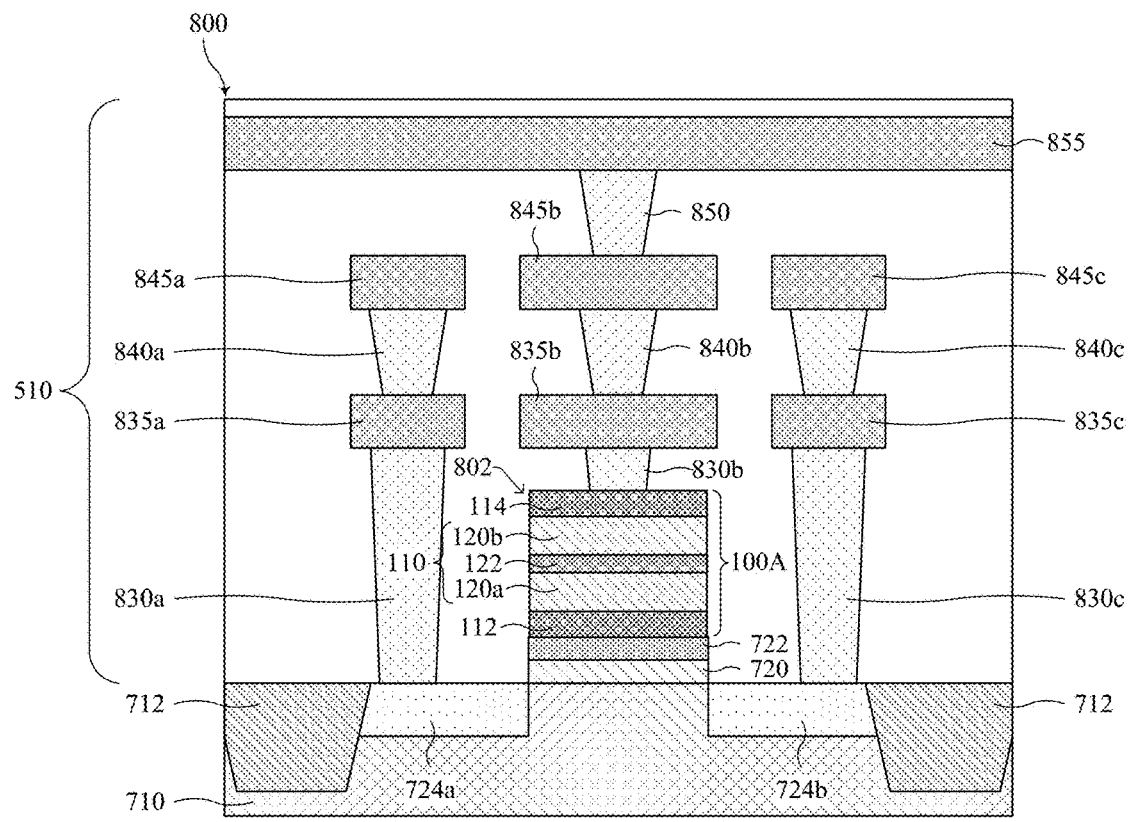
FIG. 10 and FIG. 11 are fragmentary cross-sectional views of FeFET-like memory devices, in portion or entirety, according to various aspects of the present disclosure.

The present disclosure contemplates the ferroelectric stacks described herein being implemented in FeFET-like memory devices, where the ferroelectric stacks are connected to or combined with a metal gate of a transistor. For example, FIG. 10 is a fragmentary cross-sectional view of an FeFET-like memory device 800, in portion or entirety, according to various aspects of the present disclosure. In FIG. 10, FeFET-like memory device 800 includes a transistor 802 having a metal gate with an MFM-MIS structure, such as an MFM stack (here, ferroelectric stack 100A) connected to a metal-insulator-semiconductor (MIS) structure (here, gate electrode 722-gate dielectric 720-semiconductor substrate 710), where the metal gate is disposed between source/drain region 724a and source/drain region 724b. In some embodiments, FeFET-like memory device 800 has an MLI feature that includes an M1 layer (including, for example, a device-level contact 830a, a device-level contact 830b, a device-level contact 830c, a metal line 835a, a metal line 835b, a metal line 835c, and dielectric layers of dielectric structure 510 in which device-level contacts 830a-830c and metal lines 835a-835c are disposed), an M2 layer (including, for example, a via 840a, a via 840b, a via 840c, a metal line 845a, a metal line 845b, a metal line 845c, and dielectric layers of dielectric structure 510 in which vias 840a-840c and metal lines 845a-845c are disposed), and an M3 layer (including, for example, a via 850, a metal line 855, and dielectric layers of dielectric structure 510 in which via 850 and metal line 855 are disposed). Device-level contacts 830a-830c, metal lines 835a-835c, vias 840a-840c, metal lines 845a-845c, via 850, and metal line 855 are similar to and can be configured as interconnect 515, interconnect 520, and/or other interconnect described herein. Device-level contact 830a is a source/drain contact connected to source/drain region 724a of transistor 802, device-level contact 830b is a gate contact (or gate via) connected to the metal gate of transistor 802, and device-level contact 830c is a source/drain contact connected to source/drain region 724b of transistor 802. In the depicted embodiment, metal line 845a is configured as a bit line electrically connected to source/drain region 724a of transistor 802 by via 840a, metal line 835a, and device-level contact 830a; metal line 855 is configured as a word line electrically connected to the metal gate of transistor 802 (in particular, top electrode 114 of ferroelectric stack 100A) by via 50, metal line 845b, via 840b, metal line 835b, and device-level contact 830b; and metal line 845c is configured as a source line electrically connected to source/drain region 724b of transistor 802 by via 840c, metal line 835c, and device-level contact 830c. The source line, the word line, and the bit line are electrically connected to respective voltages, such that voltages can be applied to the source line, the word line, and/or the bit line to read and/or write to ferroelectric stack 100A of transistor 802. In some embodiments, the voltages are applied to the source line, the word line, and/or the bit line to provide suitable bias conditions for writing data state to and/or reading data from FSL stack 110 of transistor 802, such as described herein. In the depicted embodiment, ferroelectric stack 100A is disposed directly on and physically contacts gate electrode 722. In some embodiments, ferroelectric stack 100A is electrically, but not physically, connected to gate electrode 722. In such embodiments, one or more device-level contacts, vias, and/or metal lines can be disposed between and electrically connect ferroelectric stack 100A to gate electrode 722. In such embodiments, a metal line configured as a bit line of FeFET-like memory device 800 may be disposed higher than M3 layer. The present disclosure contemplates other electrical connections to transistor 802 and/or other devices to configure FeFET-like memory device 800 as a non-volatile memory that can store data. FIG. 10 has been simplified for the sake of clarity to better understand the inventive concepts of the present disclosure. Additional features can be added in FeFET-like memory device 800, and some of the features described below can be replaced, modified, or eliminated in other embodiments of in FeFET-like memory device 800.

Figure 11:
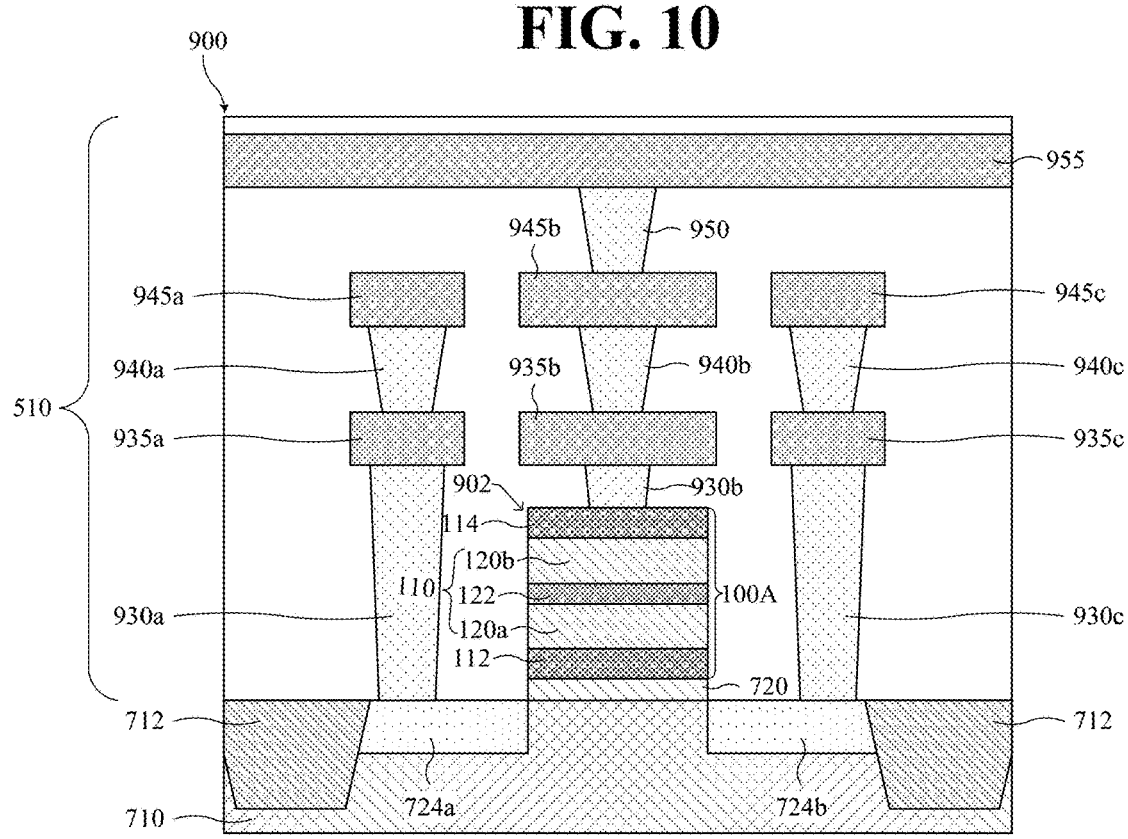

The present disclosure contemplates the ferroelectric stacks described herein being implemented in FeFET-like memory devices, where the ferroelectric stacks replace a gate electrode of a metal gate of a transistor. For example, FIG. 11 is a fragmentary cross-sectional view of an FeFET-like memory device 900, in portion or entirety, according to various aspects of the present disclosure. FeFET-like memory device 900 is similar in many respects to FeFET-like memory device 800 in FIG. 10, except FeFET-like memory device 900 includes a transistor 902 having a metal gate with an MFMIS structure, such as an MFM stack (here, ferroelectric stack 100A), gate dielectric 722, and semiconductor substrate 710, where the metal gate is disposed between source/drain region 724a and source/drain region 724b. The metal gate stack of transistor 902 thus does not include gate electrode 722. In some embodiments, FeFET-like memory device 900 has an MLI feature that includes an M1 layer (including, for example, a device-level contact 930a, a device-level contact 930b, a device-level contact 930c, a metal line 935a, a metal line 935b, a metal line 935c, and dielectric layers of dielectric structure 510 in which device-level contacts 930a-930c and metal lines 935a-935c are disposed), an M2 layer (including, for example, a via 940a, a via 940b, a via 940c, a metal line 945a, a metal line 945b, a metal line 945c, and dielectric layers of dielectric structure 510 in which vias 940a-940c and metal lines 945a-945c are disposed), and an M3 layer (including, for example, a via 950, a metal line 955, and dielectric layers of dielectric structure 510 in which via 950 and metal line 955 are disposed). Device-level contacts 930a-930c, metal lines 935a-935c, vias 940a-940c, metal lines 945a-945c, via 950, and metal line 955 are similar to and can be configured as interconnect 515, interconnect 520, and/or other interconnect described herein. Device-level contact 930a is a source/drain contact connected to source/drain region 724a of transistor 902, device-level contact 930b is a gate contact connected to the metal gate of transistor 902, and device-level contact 930c is a source/drain contact connected to source/drain region 724b of transistor 902. In the depicted embodiment, metal line 945a is configured as a bit line electrically connected to source/drain region 724a of transistor 902 by via 940a, metal line 935a, and device-level contact 930a; metal line 955 is configured as a word line electrically connected to the metal gate of transistor 902 (in particular, top electrode 114 of ferroelectric stack 100a) by via 50, metal line 945b, via 940b, metal line 935b, and device-level contact 930b; and metal line 945c is configured as a source line electrically connected to source/drain region 724b of transistor 902 by via 940c, metal line 935c, and device-level contact 930c. The source line, the word line, and the bit line are electrically connected to respective voltages, such that voltages can be applied to the source line, the word line, and/or the bit line to read and/or write to ferroelectric stack 100A of transistor 902. In some embodiments, the voltages are applied to the source line, the word line, and/or the bit line to provide suitable bias conditions for writing data to and/or reading data from FSL stack 110 of transistor 902, such as described herein. In the depicted embodiment, ferroelectric stack 100A is disposed directly on and physically contacts gate dielectric 720. In some embodiments, ferroelectric stack 100A is electrically, but not physically, connected to gate dielectric 720. In such embodiments, one or more device-level contacts, vias, and/or metal lines can be disposed between and electrically connect ferroelectric stack 100A to gate dielectric 722. In such embodiments, a metal line configured as a bit line of FeFET-like memory device 900 may be disposed higher than M3 layer. The present disclosure contemplates other electrical connections to transistor 902 and/or other devices to configure FeFET-like memory device 900 as a non-volatile memory that can store data. FIG. 11 has been simplified for the sake of clarity to better understand the inventive concepts of the present disclosure. Additional features can be added in FeFET-like memory device 900, and some of the features described below can be replaced, modified, or eliminated in other embodiments of in FeFET-like memory device 900.

Figure 12:
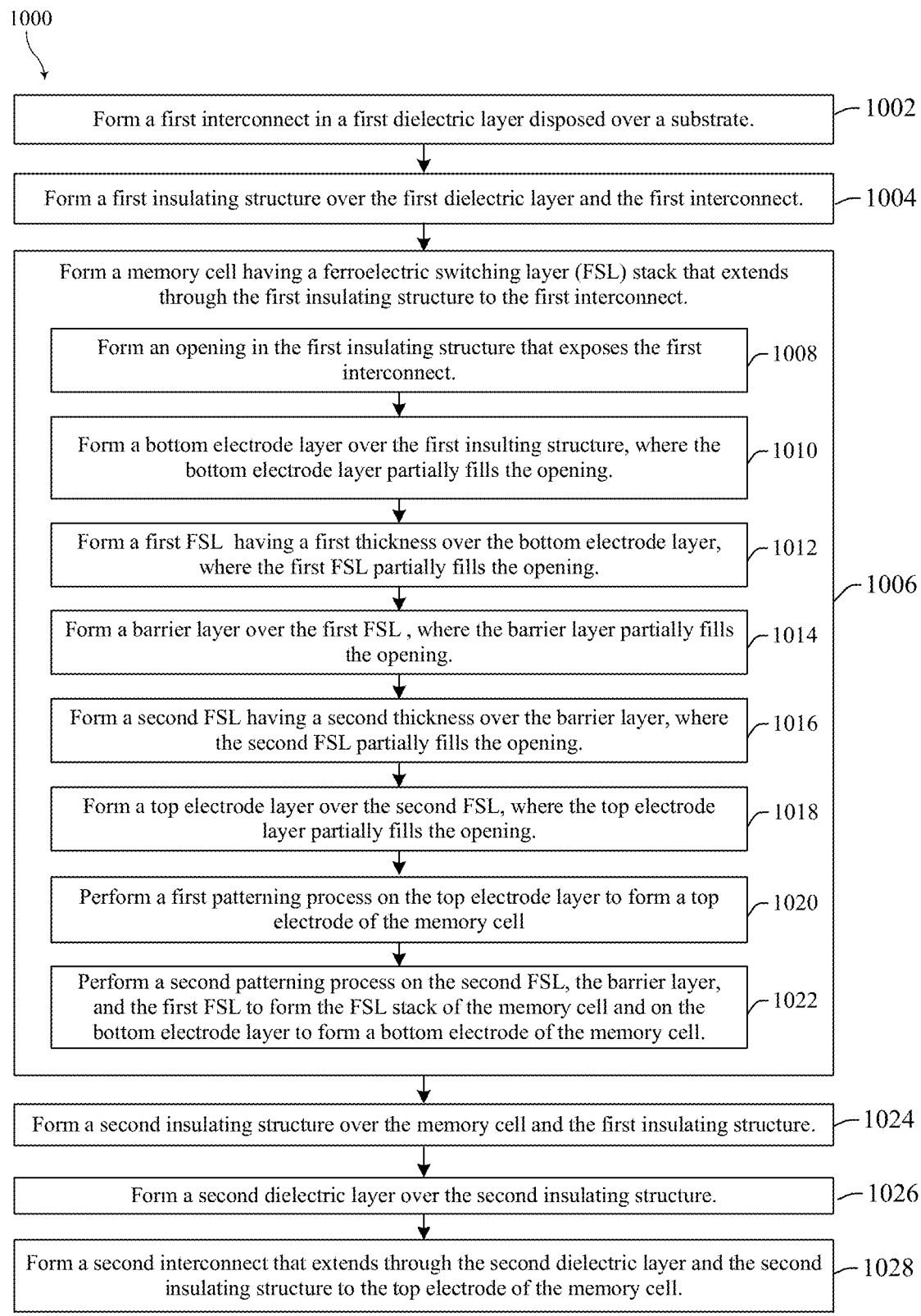
FIG. 12 is a flow chart of a method for fabricating a ferroelectric memory device, in portion or entirety, according to various aspects of the present disclosure.

FIG. 12 is a flow chart of a method 1000 for fabricating a ferroelectric memory device, such as those described herein, according to various aspects of the present disclosure. FIGS. 13A-13I are fragmentary diagrammatic cross-sectional views of a ferroelectric memory device (such as device 500B in FIG. 7B), in portion or entirety, at various fabrication stages (such as those associated with method 1000 in FIG. 12) according to various aspects of the present disclosure. For ease of discussion and understanding, FIG. 12 and FIGS. 13A-13I will be discussed concurrently in context of fabricating a ferroelectric memory device, such as device 500B, having ferroelectric stack 100A. The present disclosure contemplates embodiments where method 1000 (in some embodiments, with modifications) is implemented to fabricate any of the ferroelectric stacks disclosed herein. FIG. 12A and FIGS. 13A-13I have been simplified for the sake of clarity to better understand the inventive concepts of the present disclosure. Additional steps can be provided before, during, and after method 1000, and some of the steps described can be moved, replaced, or eliminated for additional embodiments of method 1000.

At block 1002, method 1000 includes forming a first interconnect in a first dielectric layer disposed over a substrate. For example, in FIG. 13A, processing includes depositing an ILD layer over substrate 130 (which can form a portion or entirety of lower dielectric portion 510L), patterning the ILD layer to form an opening therein, depositing one or more conductive layers (e.g., metal layers) over the ILD layer that fill the opening, and performing a planarization process the removes portions of the one or more conductive layers disposed over a top surface of the ILD layer, thereby forming interconnect 515 disposed in lower dielectric portion 510L. As described herein, interconnect 515 may be a device-level contact, a via, or a metal line. In some embodiments, the patterning can implement a single damascene process, a dual damascene process, other suitable patterning process, or combinations thereof. Deposition processes implemented for depositing the ILD layer and/or the one or more conductive layers can include chemical vapor deposition (CVD), physical vapor deposition (PVD), atomic layer deposition (ALD), high density plasma CVD (HDPCVD), metalorganic chemical vapor deposition (MOCVD), remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. In some embodiments, the ILD layer is formed by a flowable CVD (FCVD) process that includes, for example, depositing a flowable material (such as a liquid compound) over substrate 130 and converting the flowable material to a solid material by a suitable technique, such as thermal annealing and/or ultraviolet radiation treating.

At block 1004, method 1000 proceeds with forming a first insulating structure over the first dielectric layer and the first interconnect. A material of the first insulating structure is different than a material of the first dielectric layer and a material of the first interconnect to provide etching selectivity during subsequent processing. For example, in FIG. 13A, processing includes depositing insulating layer 542 over lower dielectric portion 510L and interconnect 515 by any suitable process, such as CVD, PVD, ALD, FCVD, HDPCVD, MOCVD, RPCVD, PECVD, LPCVD, ALCVD, APCVD, other suitable methods, or combinations thereof. In some embodiments, insulating layer 542 is a silicon carbide layer. In some embodiments, insulating layer 542 includes a multi-layer structure having more than one dielectric layer.

Figure 13A:
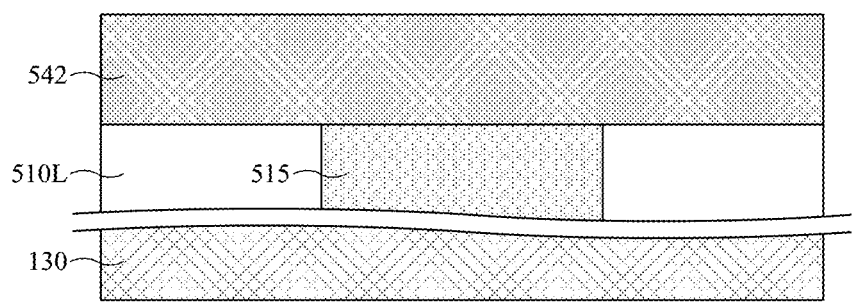
FIGS. 13A-13I are fragmentary diagrammatic cross-sectional views of a ferroelectric memory device, in portion or entirety, at various fabrication stages (such as those associated with the method in FIG. 12) according to various aspects of the present disclosure.
Figure 13B:
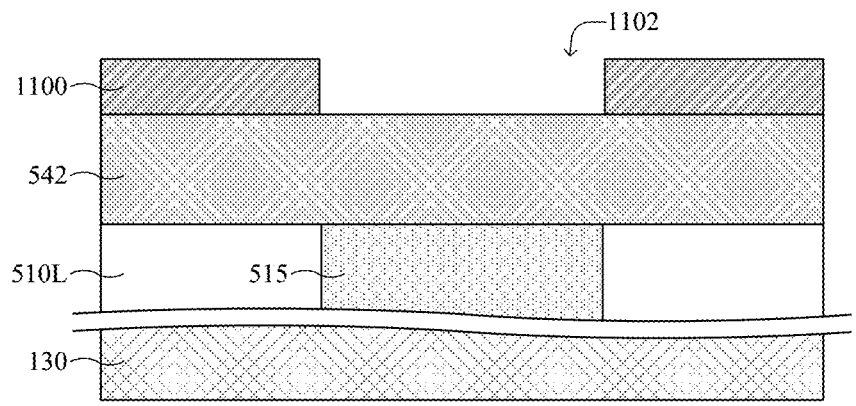
Figure 13C:
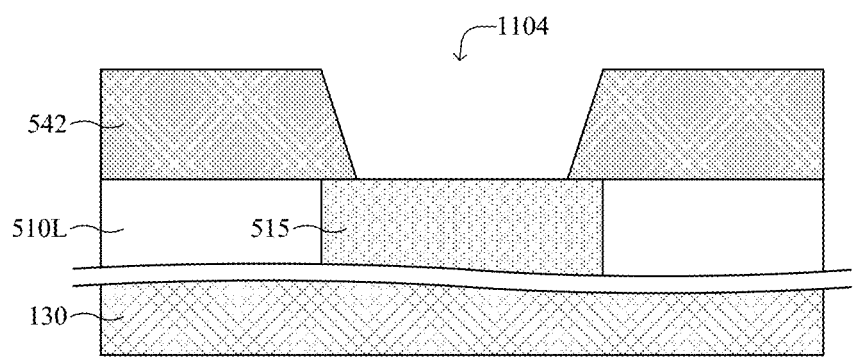
Figure 13D:
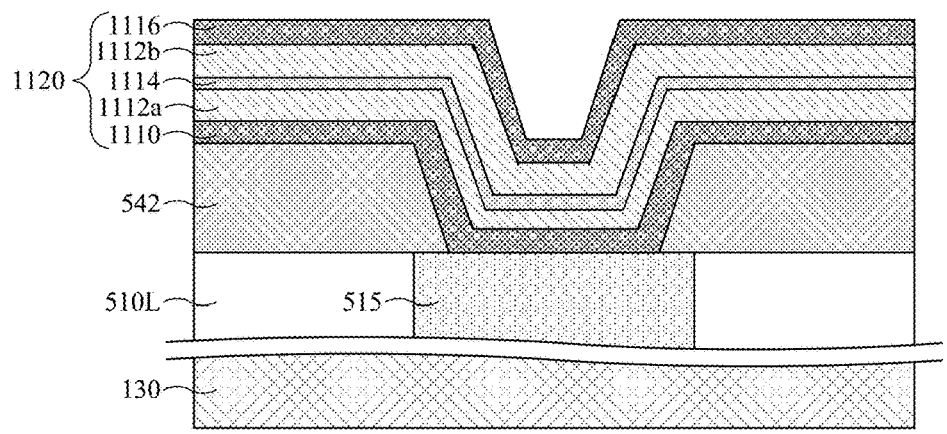
Figure 13E:
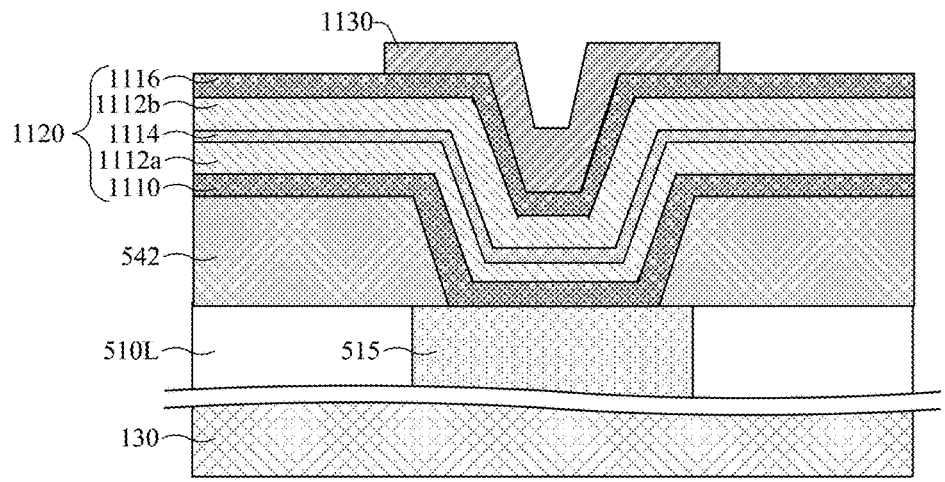
Figure 13F:
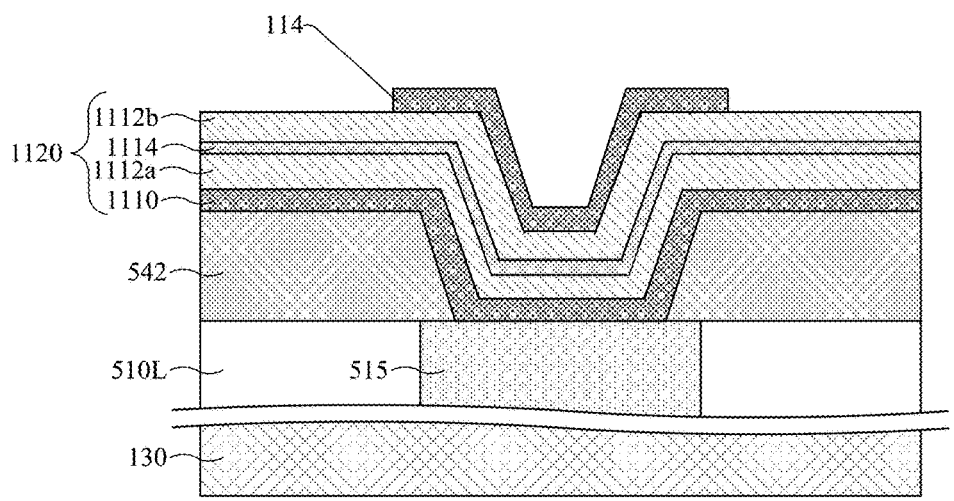
Figure 13G:
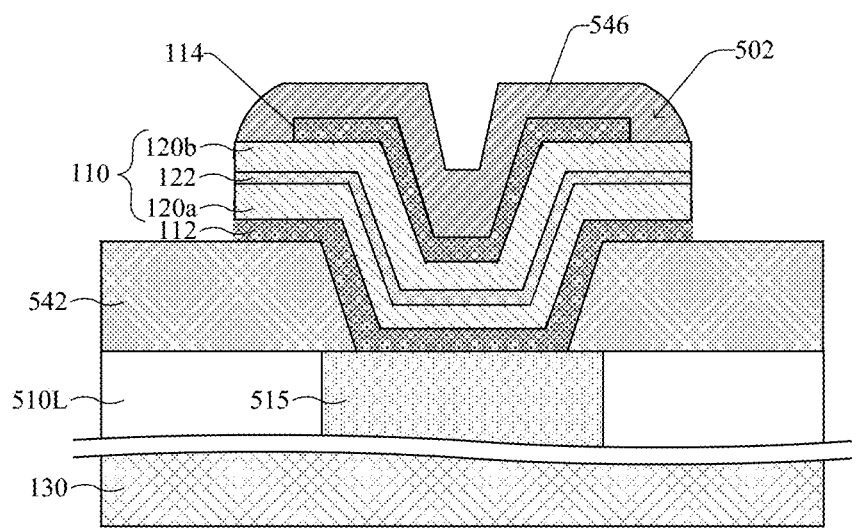
Figure 13H:
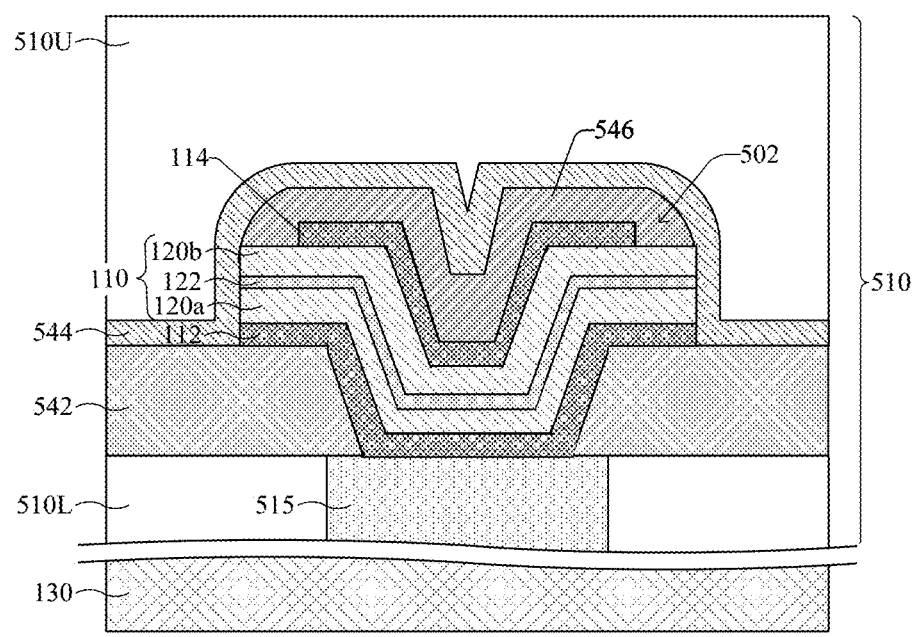
Figure 13I:
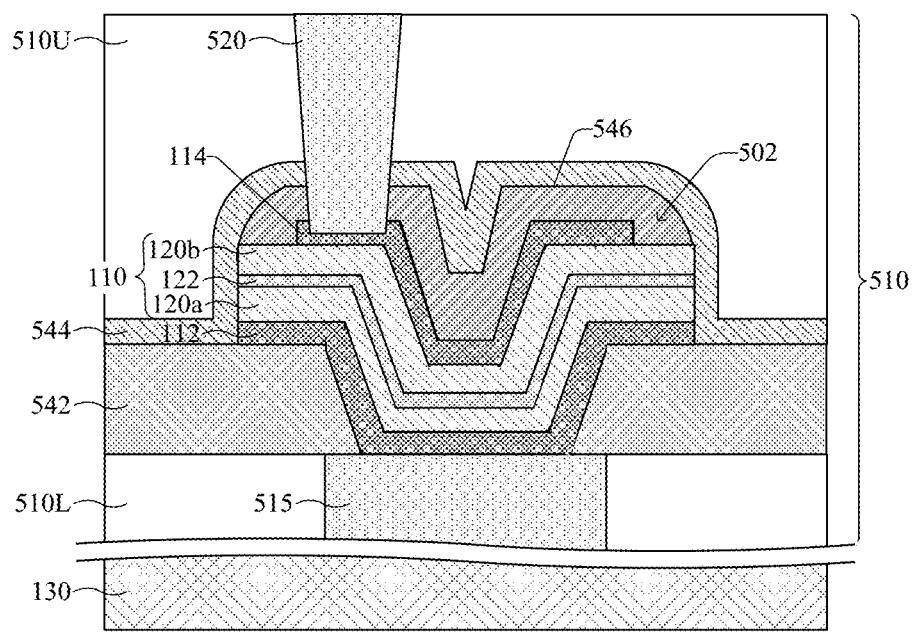

At block 1006, method 1000 proceeds with forming a memory cell having an FSL stack that extends through the first insulating structure to the first interconnect, such as depicted in FIGS. 13B-13F. At block 1008, forming the memory cell can include forming an opening in the first insulating structure that exposes the first interconnect. For example, in FIG. 13B and FIG. 13C, processing includes depositing a mask layer 1100 over insulating layer 542, patterning mask layer 1100 to form an opening 1102 that exposes, partially or entirely, a portion of insulating layer 542 overlying interconnect 515, etching insulating layer 542 using patterned mask layer 1100 as an etch mask to form an opening 1104 in insulating layer 542 that exposes interconnect 515, and removing patterned mask layer 1100 during and/or after the etching of insulating layer 542. Mask layer 1100 is a resist layer, a hard mask layer, other suitable patterning layer, or combinations thereof. The etching can include a dry etching process, a wet etching process, other suitable etching process, or combinations thereof. In FIG. 13C, opening 1104 has a tapered width formed by slanted sidewalls of insulating layer 542. The present disclosure contemplates opening 1104 having different profiles, such as a substantially uniform width formed substantially vertical sidewalls of insulating layer 542.

At blocks 1010-1018, forming the memory cell can include forming a bottom electrode layer over the first insulating structure at block 1010, forming a first FSL having a first thickness over the bottom electrode layer at block 1012, forming a barrier layer over the first FSL at block 1014, forming a second FSL having a second thickness over the barrier layer at block 1016, and forming a top electrode layer over the second FSL at block 1018, where the bottom electrode layer, the first FSL, the barrier layer, the second FSL, and the top electrode layer fill the opening. For example, in FIG. 13D, processing includes depositing a bottom electrode layer 1110 over insulating structure 542, where bottom electrode layer 1110 covers a top surface of insulating layer 542 and partially fills opening 1104; depositing a first FSL 1112a having a first thickness over bottom electrode layer 1110, where first FSL 1112a is disposed over the top surface of insulating layer 542 and partially fills opening 1104; depositing a barrier layer 1114 over first FSL 1112a, where barrier layer 1114 is disposed over the top surface of insulating layer 542 and partially fills opening 1104; depositing a second FSL 1112b over barrier layer 1114, where second FSL 1112b is disposed over the top surface of insulating layer 542 and partially fills opening 1104; and depositing a top electrode layer 1116 over second FSL 1112b, where top electrode layer 1116 is disposed over the top surface of insulating layer 542 and fills a remainder of opening 1104. Bottom electrode layer 1110 conforms to and covers sidewalls and bottom of opening 1104, which are formed by insulating layer 542 and interconnect 515, respectively. Bottom electrode layer 1110, first FSL 1112a, barrier layer 1114, second FSL 1112b, and top electrode layer 1116 form a ferroelectric stack 1120 having an FSL stack (e.g., first FSL 1112a, barrier layer 1114, and second FSL 1112b). Bottom electrode layer 1110, first FSL 1112a, barrier layer 1114, second FSL 1112b, and/or top electrode layer 1116 are deposited by CVD, PVD, ALD, FCVD, HDPCVD, MOCVD, RPCVD, PECVD, LPCVD, ALCVD, APCVD, other suitable methods, or combinations thereof. In the depicted embodiment, bottom electrode layer 1110, first FSL 1112a, barrier layer 1114, second FSL 1112b, and top electrode layer 1116 are formed by conformal deposition processes, such that bottom electrode layer 1110, first FSL 1112a, barrier layer 1114, second FSL 1112b, and top electrode layer 1116 each have a substantially uniform thickness over various surfaces.

According to embodiments of the present disclosure, first FSL 1112a and second FSL 1112b each include a ferroelectric material having a crystalline structure, and in particular, having substantially orthorhombic crystalline structures to enhance ferroelectric characteristics and performance characteristics of memory cell 502. In some embodiments, forming first FSL 1112a and second FSL 1112b includes depositing ferroelectric materials, where deposition parameters of the deposition processes are configured (tuned) to suppress growth of non-ferroelectric crystal phases, such as the M-phase, and/or suppress grain size growth in the ferroelectric materials, such as grain size of M-phase portions and/or grain size of O-phase portions, as thickness of the ferroelectric materials increases. Deposition parameters that can be tuned include deposition precursors, deposition precursor flow rates, deposition temperature, deposition time, deposition pressure, source power, radio frequency (RF) bias voltage, RF bias power, other suitable deposition parameters, or combinations thereof. In some embodiments, deposition precursor flow rates, deposition temperature, deposition time, and/or deposition pressure are tuned when forming first FSL 1112a and second FSL 1112b to provide ferroelectric materials having the first thickness and the second thickness, respectively, each of which is less than a threshold thickness where non-ferroelectric crystal phase transitions and/or grain sizes that can cause non-ferroelectric conditions are observed. For example, the first thickness of FSL 1112a and the second thickness of second FSL 1112b can be thickness T1 and thickness T2, respectively, as described above. In some embodiments, deposition precursor flow rates, deposition temperature, deposition time, and/or deposition pressure are tuned when forming first FSL 1112a and second FSL 1112b to provide ferroelectric materials having thicknesses that optimize memory windows of memory cell 502. Because barrier layer 1114 is deposited on first FSL 1112a and second FSL 1112b is deposited on barrier layer 1114, deposition of the ferroelectric material of first FSL 1112a is stopped before crystal phase transitions and/or grain sizes can occur in the crystalline structure of the ferroelectric material that decrease ferroelectricity, and the ferroelectric material of second FSL 1112b does not take on the crystalline structure and/or grain sizes of the ferroelectric material of first FSL 1112a, such that the ferroelectric material of second FSL 1112b does not exhibit crystal phase transitions in its crystalline structure and/or grain sizes that decrease ferroelectricity as thickness of second FSL 1112b increases. In other words, barrier layer 1114 interrupts overall grain growth of an FSL (here, first FSL 1112a and second FSL 1112b) in ferroelectric stack 1120, which provides FSL sub-layers (here, first FSL 1112a and second FSL 1112b) having ferroelectric materials with crystalline structures having substantially ferroelectric phases, such as the O-phase, and with grain sizes that suppress non-ferroelectric behavior. This, in part, increases a ferroelectricity of first FSL 1112a and a ferroelectricity second FSL 1112b, which can increase a number of switching operations that may be performed by memory cell 502. In some embodiments, forming barrier layer 1114 includes depositing a dielectric material, where deposition parameters of the deposition processes are configured (tuned) to provide the dielectric material with a higher band gap than FSL 1112a and/or FSL 1112b (for leakage current reduction, for example) and/or with a crystalline condition that ensures interruption of grain growth between first FSL 1112a and second FSL 1112a. In some embodiments, deposition precursor flow rates, deposition temperature, deposition time, and/or deposition pressure are tuned when forming barrier layer 1114 to provide a dielectric material having a different crystalline condition than first FSL 1112a and second FSL 1112b (e.g., an amorphous structure), a higher energy band gap than first FSL 1112a and second FSL 1112b, and a thickness that optimizes performance.

At block 1020, method 1000 proceeds with performing a first patterning process on the top electrode layer to form a top electrode of the memory cell. For example, in FIG. 13E and FIG. 13F, processing includes forming a patterned mask layer 1130 over top electrode layer 1116, where patterned mask layer 1130 covers a portion of top electrode layer 1116 disposed over interconnect 515 (FIG. 13E); etching exposed portions of top electrode layer 1116 using patterned mask layer 1130 as an etch mask, where a remainder of top electrode layer 1116 forms top electrode 114 of memory cell 502 (FIG. 13F); and removing patterned mask layer 1130 during and/or after the etching of top electrode layer 1116. Patterned mask layer 1130 is a resist layer, a hard mask layer, other suitable patterning layer, or combinations thereof. The etching includes a dry etching process, a wet etching process, other suitable etching process, or combinations thereof. In some embodiments, the etching is configured to selectively remove top electrode layer 1116 with respect to second FSL 1112b and/or patterned mask layer 1130. In other words, the etching process substantially removes top electrode layer 1116 but does not remove, or does not substantially remove, second FSL 1112b and/or patterned mask layer 1130. For example, an etchant is selected for the etch process that etches metal material (i.e., top electrode layer 1116) at a higher rate than ferroelectric material (i.e., second FSL 1112b, such as a metal oxide material) (i.e., the etchant has a high etch selectivity with respect to metal). After such processing, a length of top electrode 114 along a lateral direction is less than a length of second FSL 1112a, barrier layer 1114, first FSL 1112b, and bottom electrode layer 1110, such that sidewalls of top electrode 114 are not aligned with sidewalls of second FSL 1112a, barrier layer 1114, first FSL 1112b, and/or bottom electrode layer 1110.

At block 1022, method 1000 proceeds with performing a second patterning process on the second FSL, the barrier layer, and the first FSL to form the FSL stack of the memory cell and on the bottom electrode layer to form a bottom electrode of the memory cell. For example, in FIG. 13G, processing can includes depositing a hard mask layer over ferroelectric stack 1120 (in particular, top electrode 114 and second FSL 1112b); performing a patterning process on the hard mask layer, thereby providing hard mask layer 546 covering top electrode 114 and a portion of second FSL 1112b, barrier layer 1114, first FSL 1112a, and bottom electrode layer 1110 that extend laterally beyond top electrode 114; etching exposed portions of ferroelectric stack 1120 (i.e., second FSL 1112b, barrier layer 1114, first FSL 1112a, and bottom electrode layer 1110) using hard mask layer 546 as an etch mask, where a remainder of second FSL 1112b, barrier layer 1114, first FSL 1112a, and bottom electrode layer 1110 forms FSL 120b, barrier layer 122, FSL 120a, and bottom electrode 112, respectively, of memory cell 502. The patterned mask layer (i.e., hard mask layer 546) is not removed during and/or after the second patterning process. The etching includes a dry etching process, a wet etching process, other suitable etching process, or combinations thereof. In some embodiments, the etching is configured to selectively remove the various exposed layers of ferroelectric stack 1120 (i.e., second FSL 1112b, barrier layer 1114, first FSL 1112a, and bottom electrode layer 1110) with respect to hard mask layer 546 and/or insulating layer 542. In other words, the etching process substantially removes second FSL 1112b, barrier layer 1114, first FSL 1112a, and/or bottom electrode layer 1110 but does not remove, or does not substantially remove, hard mask layer 546 and/or insulating layer 542. For example, an etchant is selected for the etch process that etches metal-comprising dielectric materials (i.e., second FSL 1112b, barrier layer 1114, and/or first FSL 1112a, such as metal oxide materials) and/or metal materials (i.e., bottom electrode layer 1110) at a higher rate than silicon-comprising dielectric materials (i.e., hard mask layer 546, such as silicon nitride materials, and/or insulating layer 542, such as silicon carbide materials) (i.e., the etchant has a high etch selectivity with respect to metal-comprising dielectric materials and/or metal materials). In some embodiments, the etching is a multi-step etch process. For example, the etching process may alternate etchants and/or tune other etch parameters (e.g., etch time, etch temperature, etch pressure, flow rate of etchants, etc.) to separately and alternately remove second FSL 1112b, then barrier layer 1114, then first FSL 1112a, and then bottom electrode layer 1110. In another example, the etching process may alternate etchants and/or tune other etch parameters to remove second FSL 1112b, barrier layer 1114, and first FSL 1112a with respect to hard mask layer 546 and/or bottom electrode layer 1110 in a first etch step and then bottom electrode layer 1110 with respect to hard mask layer 546 and/or insulating layer 542 in a second etch step. After such processing, a length of FSL 120b, barrier layer 122, FSL 120a, and bottom electrode 112 along a lateral direction is substantially the same along a lateral direction and greater than a length of top electrode 114 along the lateral direction, such that sidewalls of FSL 120b, barrier layer 122, FSL 120a, and bottom electrode 112 are substantially aligned with one another, but not aligned with sidewalls of top electrode 114. The present disclosure contemplates embodiments where the first patterning process and the second patterning process are performed on more or less layers of ferroelectric stack 1120 to provide various different configurations of ferroelectric stack 100A (e.g., slanted sidewalls, stepped sidewalls, vertical sidewalls, etc.). The present disclosure also contemplates some embodiments where only one patterning process or more than two patterning processes are performed on the various layers of ferroelectric stack 1120 provide various different configurations of ferroelectric stack 100A, such as any of the configurations described herein. In some embodiments, each "step" of a ferroelectric stack corresponds with a respective patterning process.

At block 1024 and block 1026, method 1000 proceeds with forming a second insulating structure over the memory cell and the first insulating structure and forming a second dielectric layer over the second insulating structure, respectively. A material of the second insulating structure is different than a material of the second dielectric layer to provide etching selectivity during subsequent processing. For example, in FIG. 13H, processing includes depositing insulating layer 544 over memory cell 502, hard mask layer 546, lower dielectric portion 510L, and interconnect 515, and depositing an ILD layer (which can form a portion or an entirety of upper dielectric portion 510U) over insulating layer 544. Insulating layer 544 covers and/or wraps hard mask layer 546 and a portion of memory cell 502 disposed over a top surface of insulating layer 542. Deposition processes implemented for depositing insulting layer 544 and/or the ILD layer can include CVD, PVD, ALD, FCVD, HDPCVD, MOCVD, RPCVD, PECVD, LPCVD, ALCVD, APCVD, other suitable methods, or combinations thereof. In some embodiments, insulating layer 544 is formed by a conformal deposition process, such as PVD and/or ALD, such that insulating layer 544 has a substantially uniform thickness, and the ILD layer is formed by FCVD. In some embodiments, insulating layer 544 is a silicon carbide layer, and the ILD layer is a low-k dielectric layer (e.g., TEOS-formed oxide). In some embodiments, insulating layer 544 includes a multi-layer structure having more than one dielectric layer.

At block 1028, method 1000 proceeds with forming a second interconnect that extends through the second dielectric layer and the second insulating structure to the top electrode of the memory cell. For example, in FIG. 13H, processing includes patterning the ILD layer in upper dielectric portion 510U to form an opening therein, patterning insulating layer 544 and hard mask layer 546 to extend the opening through insulating layer 544 and hard mask layer 546 to expose top electrode 114, depositing one or more conductive layers (e.g., metal layers) over the ILD layer that fill the opening, and performing a planarization process that removes portions of the one or more conductive layers disposed over a top surface of the ILD layer, thereby forming interconnect 520 disposed in lower dielectric portion 510L. As described herein, interconnect 520 may be a device-level contact, a via, or a metal line. In some embodiments, the patterning can implement a single damascene process, a dual damascene process, other suitable patterning process, or combinations thereof.

Ferroelectric stacks (e.g., ferroelectric stack 100A, ferroelectric stack 100B, ferroelectric stack 200A, ferroelectric stack 200B, ferroelectric stack 300A, ferroelectric stack 300B, ferroelectric stack 400A, and/or ferroelectric stack 400B) and/or ferroelectric-based devices (e.g., device 500A, device 500B, device 600, ferroelectric memory device 700, FeFET-like device 800, and/or FeFET-like device 900) described herein can be included in a microprocessor, a memory, and/or other IC device. In some embodiments, one or more of the ferroelectric stacks and/or one or more of the ferroelectric-based devices described herein is a portion of an IC chip, a system on chip (SoC), or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof.

Accordingly, ferroelectric stacks are disclosed herein that can improve retention performance of ferroelectric memory devices. An exemplary ferroelectric stack has a ferroelectric switching layer (FSL) stack disposed between a first electrode and a second electrode. The ferroelectric stack includes a barrier layer disposed between a first FSL and a second FSL, where a first crystalline condition of the barrier layer is different than a second crystalline condition of the first FSL and/or a third crystalline condition of the second FSL. In some embodiments, the first crystalline condition is an amorphous phase, and the second crystalline condition and/or the third crystalline condition is an orthorhombic phase. In some embodiments, the first FSL and/or the second FSL include a first metal oxide, and the barrier layer includes a second metal oxide. In some embodiments, a first energy band gap of the barrier layer is different than (for example, greater than) a second energy band gap of the first FSL and/or a third energy band gap of the second FSL. In some embodiments, the second energy band gap of the first FSL and the third energy band gap of the second FSL are the same.

The FSL stack can be a ferroelectric capacitor, a portion of a transistor, and/or connected to a transistor in a ferroelectric memory device to provide data storage in a nonvolatile manner. In some embodiments, a transistor disposed over a substrate, the FSL stack is disposed over the substrate, an interconnect structure is disposed over the substrate, and the interconnect structure is electrically connected to the transistor and the FSL stack. In some embodiments, the FSL stack is electrically connected to a source/drain region of the transistor by the interconnect structure. In some embodiments, the transistor has a metal gate that includes a gate electrode disposed over a gate dielectric, and the FSL stack is electrically connected to the gate electrode. In some embodiments, the transistor has a metal gate that includes the FSL stack disposed directly on a gate dielectric. In some embodiments, the interconnect structure includes a first metallization layer forming a first level of the interconnect structure and a second metallization layer forming a second level of the interconnect structure. The second level is over the first level, and the FSL stack is disposed in the interconnect structure between and electrically connected to the first metallization layer and the second metallization layer.

An exemplary memory device includes a ferroelectric stack having a first electrode, a second electrode, a first ferroelectric layer and a second ferroelectric layer disposed between the first electrode and the second electrode, and a dielectric layer disposed between the first ferroelectric layer and the second ferroelectric layer. The first ferroelectric layer and the second ferroelectric layer include a first dielectric material, and the dielectric layer includes a second dielectric material that is different than the first dielectric material. In some embodiments, the first dielectric material has a crystalline structure and the second dielectric material has a non-crystalline structure. In some embodiments, the crystalline structure has an orthorhombic crystalline phase. In some embodiments, the first dielectric material is a first metal oxide material and the second dielectric material is a second metal oxide material. In some embodiments, a first energy band gap of the dielectric layer is greater than a second energy bandgap of the first ferroelectric layer and a third energy band gap of the second ferroelectric layer. In some embodiments, the second energy bandgap of the first ferroelectric layer and the third energy band gap of the second ferroelectric layer are the same. In some embodiments, the ferroelectric stack has slanted sidewalls, such that the ferroelectric stack has a tapered width. In some embodiments, the ferroelectric stack has vertical sidewalls, such that the ferroelectric stack has a uniform width. In some embodiments, the ferroelectric stack has stepped sidewalls, such that the ferroelectric stack has a varying width. In some embodiments, the first ferroelectric layer has a first thickness, the second ferroelectric layer has a second thickness, and the dielectric layer has a third thickness. The third thickness is less than the first thickness, and the third thickness is less than the second thickness.

An exemplary method for forming a ferroelectric memory stack includes forming a first electrode layer over a substrate, forming a first ferroelectric dielectric layer over the first electrode layer, forming a dielectric layer over the first ferroelectric dielectric layer, forming a second ferroelectric dielectric layer over the dielectric layer, and forming a second electrode layer over the second ferroelectric dielectric layer. The first ferroelectric dielectric layer has a first crystalline condition, the dielectric layer has a second crystalline condition, and the second crystalline condition is different than the first crystalline condition. The second ferroelectric dielectric layer has a third crystalline condition, and the second crystalline condition is different than the third crystalline condition. In some embodiments, the dielectric layer has a first energy band gap that is greater than a second energy band gap of the first ferroelectric dielectric layer and a third energy band gap of the second ferroelectric dielectric layer. In some embodiments, forming the first ferroelectric dielectric layer includes tuning a first deposition process to provide the first crystalline condition having an orthorhombic crystal structure, forming the dielectric layer includes tuning a second deposition process to provide the second crystalline condition having an amorphous structure, and forming the second ferroelectric dielectric layer includes tuning a third deposition process to provide the third crystalline condition having an orthorhombic crystal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a ferroelectric stack having:
a first electrode and a second electrode;
a first ferroelectric layer and a second ferroelectric layer disposed between the first electrode and the second electrode, wherein the first ferroelectric layer and the second ferroelectric layer include a first dielectric material;
a dielectric layer disposed between the first ferroelectric layer and the second ferroelectric layer, wherein the dielectric layer includes a second dielectric material that is different than the first dielectric material; and
wherein the first dielectric material has a crystalline structure having orthorhombic crystalline phase (O-phase) portions and monoclinic crystalline phase (M-phase) portions, wherein a volume of the M-phase portions in the first dielectric material is less than about 10%.

2. The memory device of claim 1, wherein the second dielectric material has a non-crystalline structure.

3. The memory device of claim 1, wherein a grain size of the M-phase portions in the first dielectric material is less than about 3 nm.

4. The memory device of claim 1, wherein the first dielectric material is a first metal oxide material and the second dielectric material is a second metal oxide material.

5. The memory device of claim 1, wherein the ferroelectric stack has slanted sidewalls, such that the ferroelectric stack has a tapered width.

6. The memory device of claim 1, wherein the ferroelectric stack has vertical sidewalls, such that the ferroelectric stack has a uniform width.

7. The memory device of claim 1, wherein the ferroelectric stack has stepped sidewalls, such that the ferroelectric stack has a varying width.

8. The memory device of claim 1, wherein a first energy bandgap of the dielectric layer is greater than a second energy bandgap of the first ferroelectric layer and a third energy band gap of the second ferroelectric layer.

9. The memory device of claim 8, wherein the second energy bandgap of the first ferroelectric layer and the third energy band gap of the second ferroelectric layer are the same.

10. The memory device of claim 1, wherein the first ferroelectric layer has a first thickness, the second ferroelectric layer has a second thickness, and the dielectric layer has a third thickness, wherein the third thickness is less than the first thickness and the third thickness is less than the second thickness.

11. A device comprising:
a transistor disposed over a substrate;
a ferroelectric memory stack disposed over the substrate, wherein the ferroelectric memory stack includes:
a first electrode and a second electrode, and
a ferroelectric switching layer (FSL) stack disposed between the first electrode and the second electrode, wherein the FSL stack includes a first FSL, a second FSL, and a barrier layer disposed between the first FSL and the second FSL, wherein a first crystalline condition of the barrier layer is different than a second crystalline condition of the first FSL and the second FSL, the first crystalline condition is an amorphous phase, the second crystalline condition is an orthorhombic phase and a monoclinic phase, and a grain size of monoclinic phase portions of the first FSL and the second FSL is less than about 3 nm; and
an interconnect structure disposed over the substrate, wherein the interconnect structure is electrically connected to the transistor and the ferroelectric memory stack.

12. The device of claim 11, wherein the ferroelectric memory stack is electrically connected to a source/drain region of the transistor by the interconnect structure.

13. The device of claim 12, wherein the interconnect structure includes:
a first metallization layer forming a first level of the interconnect structure; and
a second metallization layer forming a second level of the interconnect structure, wherein the second level is over the first level and the ferroelectric memory stack is disposed in the interconnect structure between and electrically connected to the first metallization layer and the second metallization layer.

14. The device of claim 11, wherein the transistor has a metal gate that includes a gate electrode disposed over a gate dielectric, and further wherein the ferroelectric memory stack is electrically connected to the gate electrode.

15. The device of claim 11, wherein the transistor has a metal gate that includes the ferroelectric memory stack disposed directly on a gate dielectric.

16. The device of claim 11, wherein the first FSL and the second FSL include hafnium and oxygen and the barrier layer includes aluminum and oxygen.

17. The device of claim 11, wherein a first energy band gap of the barrier layer is different than a second energy band gap of the first FSL and the second FSL.

18. A method for forming a ferroelectric memory stack, the method comprising:
forming a first electrode layer over a substrate;
forming a first ferroelectric dielectric layer over the first electrode layer, wherein the first ferroelectric dielectric layer has a first crystalline condition, wherein the forming the first ferroelectric dielectric layer includes tuning a first deposition process to suppress growth of non-ferroelectric crystal phases;
forming a dielectric layer over the first ferroelectric dielectric layer, wherein the dielectric layer has a second crystalline condition and the second crystalline condition is different than the first crystalline condition;
forming a second ferroelectric dielectric layer over the dielectric layer, wherein the second ferroelectric dielectric layer has a third crystalline condition and the second crystalline condition is different than the third crystalline condition, wherein the forming the second ferroelectric dielectric layer includes tuning a second deposition process to suppress growth of non-ferroelectric crystal phases; and
forming a second electrode layer over the second ferroelectric dielectric layer.

19. The method of claim 18, wherein: the forming the first ferroelectric dielectric layer includes tuning the first deposition process to suppress phase transitions of a first ferroelectric dielectric material from an orthorhombic crystalline phase to a monoclinic crystalline phase; the forming the dielectric layer includes tuning a third deposition process to provide the second crystalline condition having an amorphous structure; and the forming the second ferroelectric dielectric layer includes tuning the second deposition process to suppress phase transitions of a second ferroelectric dielectric material from the orthorhombic crystalline phase to the monoclinic crystalline phase.

20. The method of claim 18, wherein the dielectric layer has a first energy band gap that is greater than a second energy band gap of the first ferroelectric dielectric layer and a third energy band gap of the second ferroelectric dielectric layer.

\* \* \* \* \*